US006238851B1

(12) United States Patent
Nishi

(10) Patent No.: US 6,238,851 B1
(45) Date of Patent: *May 29, 2001

(54) EXPOSURE METHOD

(75) Inventor: Kenji Nishi, Kanagawa-ken (JP)

(73) Assignee: Nikon Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/391,354

(22) Filed: Sep. 8, 1999

Related U.S. Application Data

(63) Continuation of application No. 09/024,105, filed on Feb. 17, 1998, now abandoned, which is a continuation-in-part of application No. 08/654,419, filed on May 28, 1996, now abandoned.

(30) Foreign Application Priority Data

| May 29, 1995 | (JP) | 7-130131 |
| Jun. 20, 1995 | (JP) | 7-152856 |
| Aug. 4, 1995 | (JP) | 7-199676 |
| Aug. 9, 1995 | (JP) | 7-203276 |
| Feb. 17, 1997 | (JP) | 9-31974 |

(51) Int. Cl.[7] .................................. H01L 21/027
(52) U.S. Cl. ................ 430/394; 430/22; 430/30; 430/311; 355/77
(58) Field of Search ................ 430/22, 30, 311, 430/394; 355/77

(56) References Cited

U.S. PATENT DOCUMENTS

| 4,708,466 | 11/1987 | Isohata et al. | 355/53 |
| 4,734,746 | 3/1988 | Ushida et al. | 355/53 |
| 4,780,617 | 10/1988 | Umatate et al. | 250/548 |
| 4,792,693 | 12/1988 | Yamaguchi et al. | 250/548 |
| 5,434,026 | 7/1995 | Takatsu et al. | 430/30 |
| 5,468,580 | 11/1995 | Tanaka | 430/22 |
| 5,695,897 | 12/1997 | Mitome et al. | 430/22 |

Primary Examiner—John A. McPherson
(74) Attorney, Agent, or Firm—Oliff & Berridge PLC

(57) ABSTRACT

In the exposure method of the present invention, exposure is effected with respect to shot areas S1 to S24 in a first layer on a wafer W using a scanning type exposure apparatus having an exposure field of a three-chip size and subsequently, exposure is effected with respect to shot areas SA1 to SAM in a second layer on the first layer, using a one-shot type exposure apparatus having an exposure field of, for example, a single-chip size. For exposure of the second layer, shot areas S1, S3, S5, . . . , S24 in the first layer are selected from the shot areas in the first layer and the respective central chip patterns C2 in the shot areas S1, S3, S5, . . . , S24 are selected as sample shots. Accordingly, sample shots 37A to 37J are selected from the shot areas in the second layer, and alignment is conducted by the EGA method, based on the positions of wafer marks included in the sample shots. By the exposure method of the present invention, separation of in-shot errors are accurately conducted, so that a high overlay accuracy can be achieved.

21 Claims, 12 Drawing Sheets

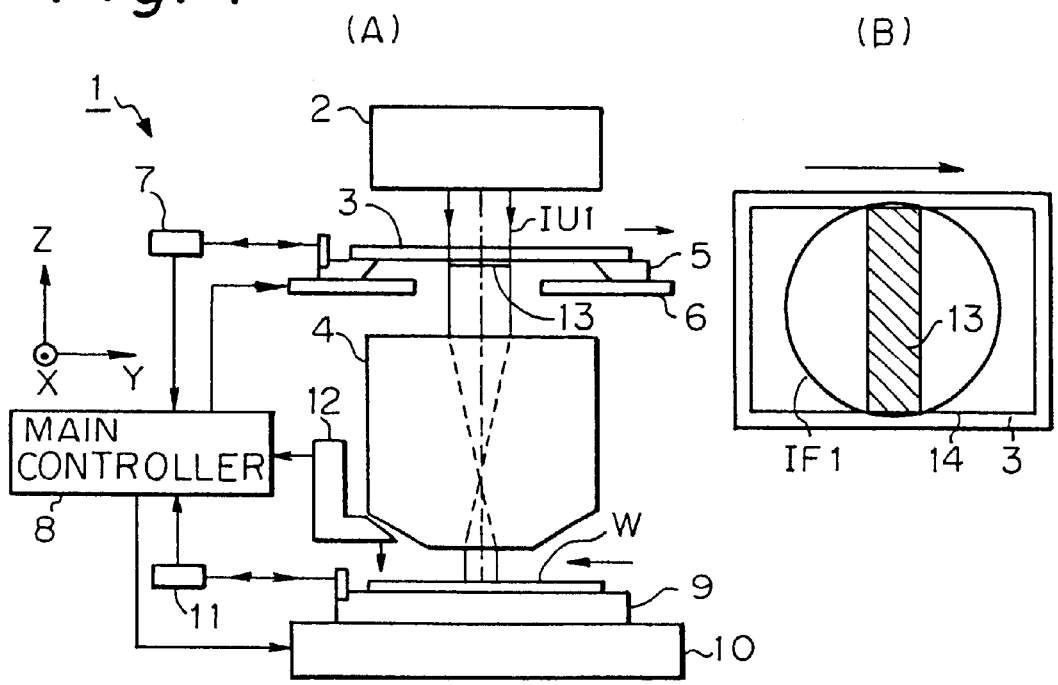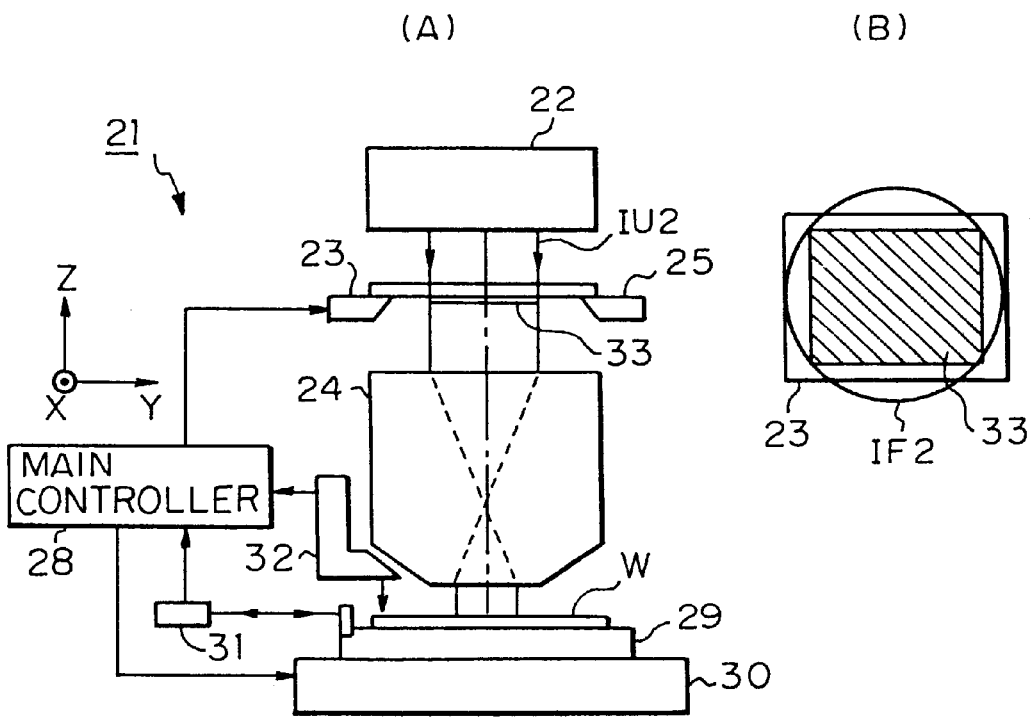

Fig. 3
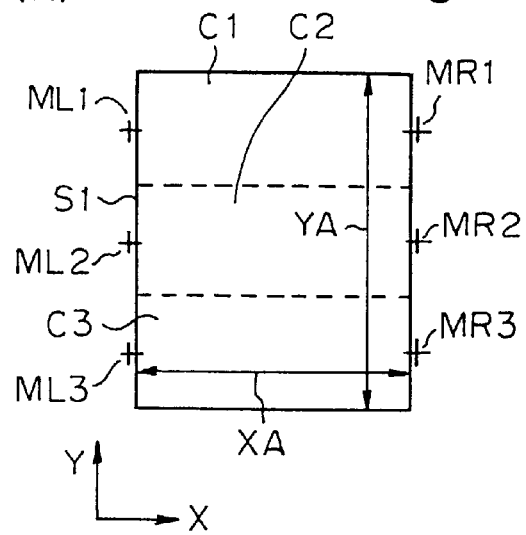
(A)
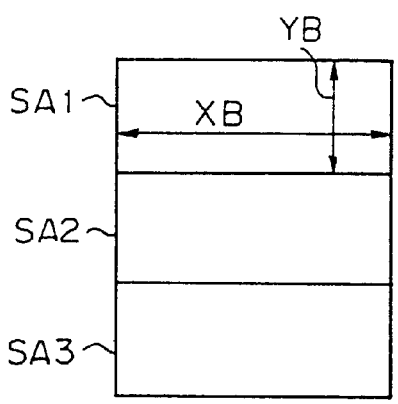
(B)
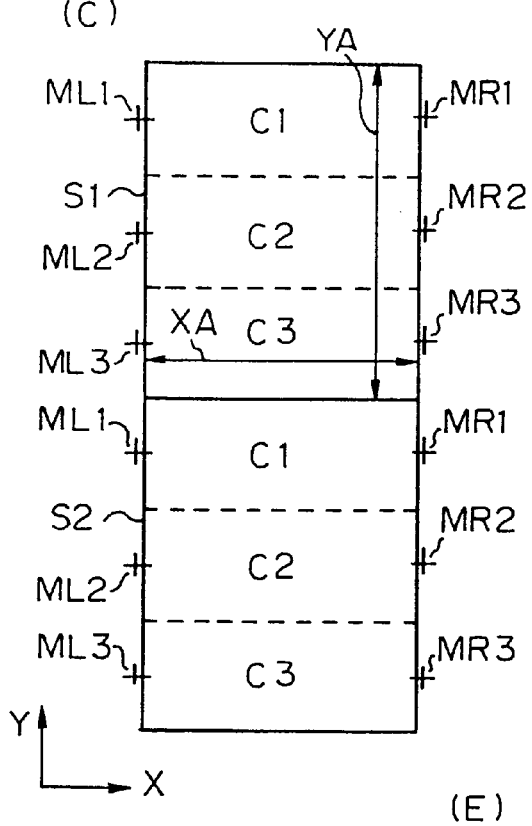
(C)
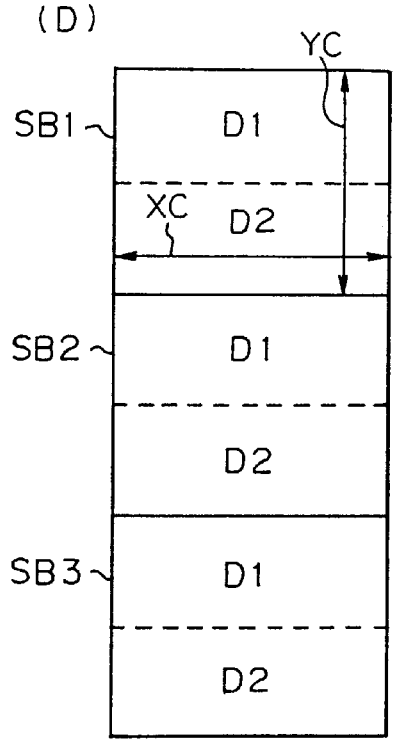
(D)
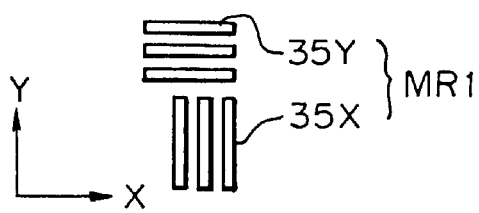
(E)

Fig. 6
(A)
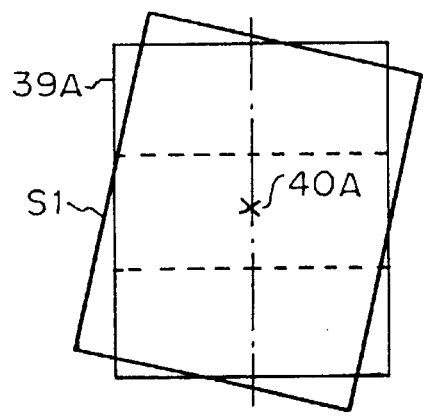
(B)
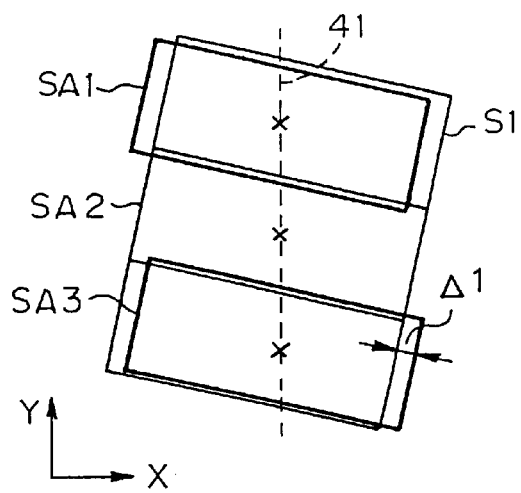
(C)
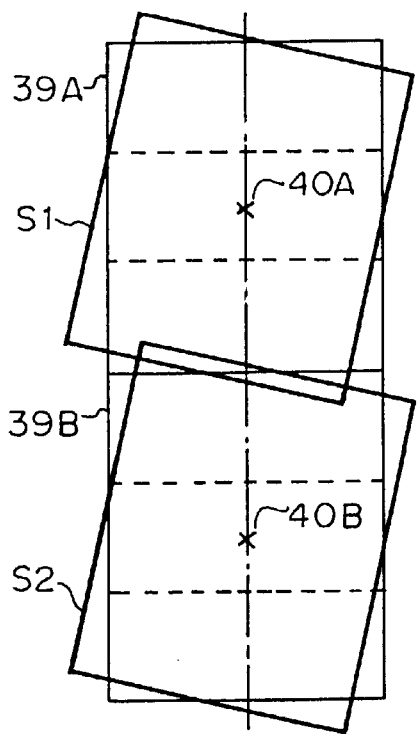
(D)
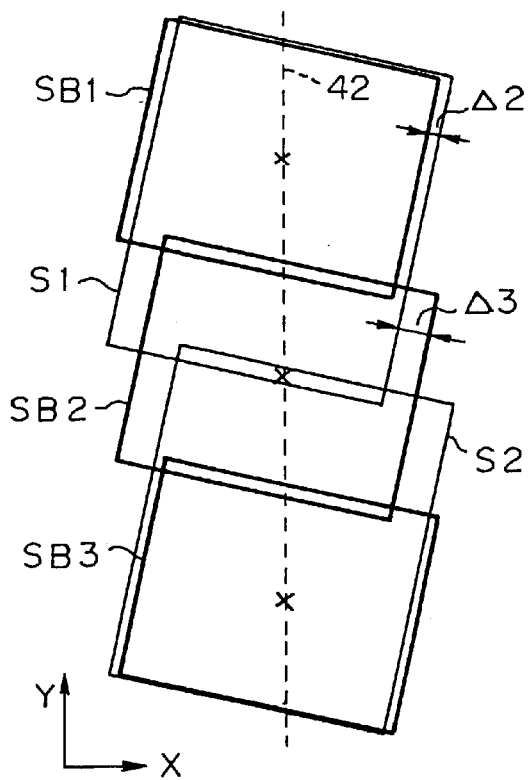

Fig. 7
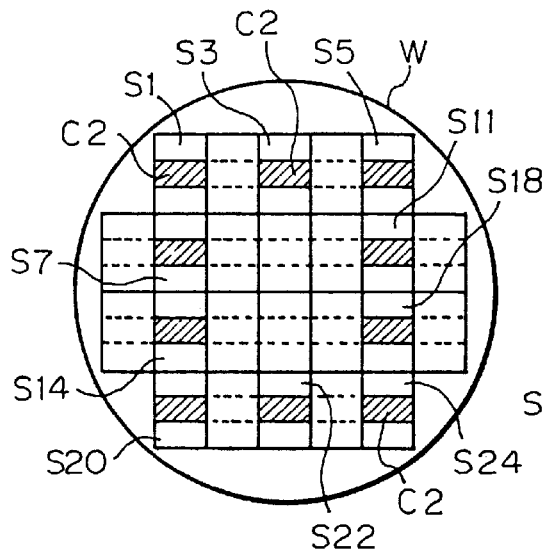
(A)
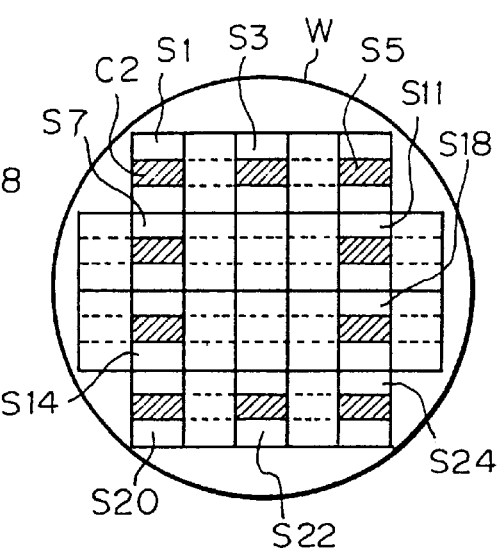
(C)
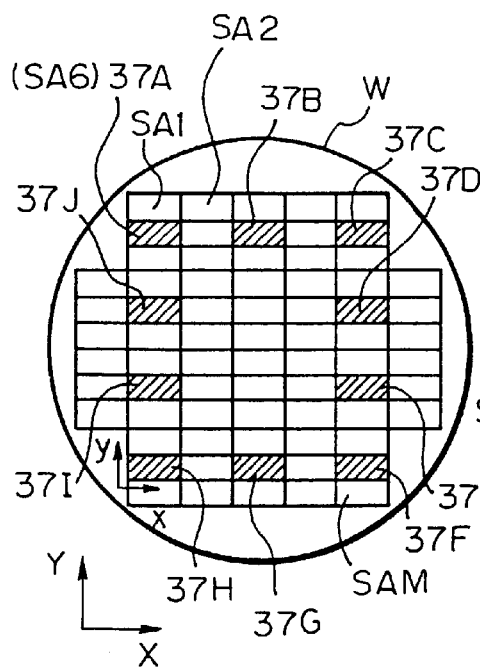
(B)
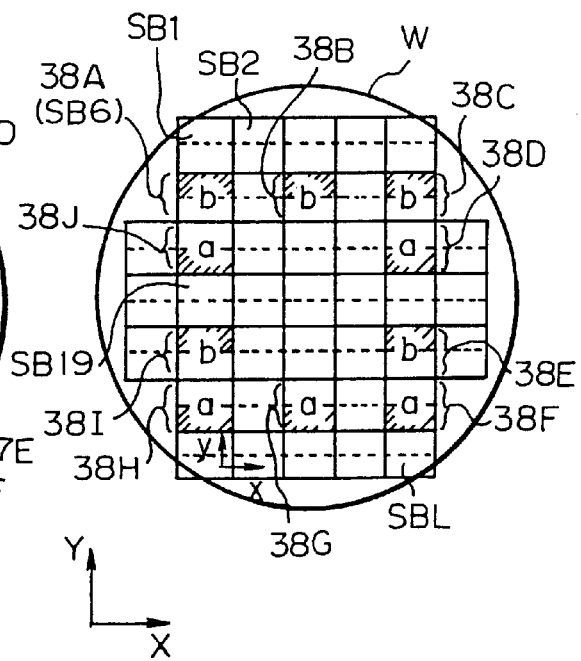
(D)

Fig. 8
(A)
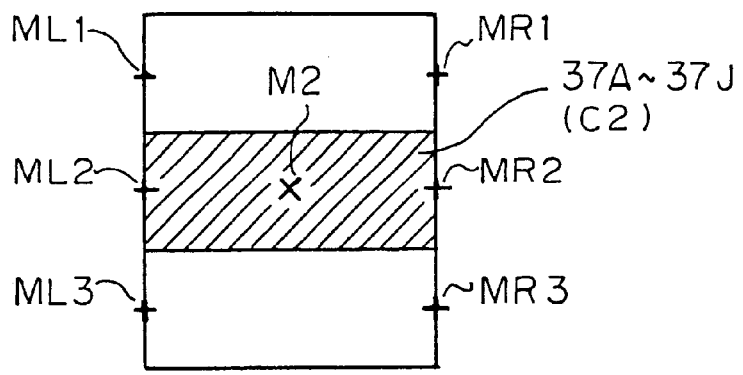
(B)
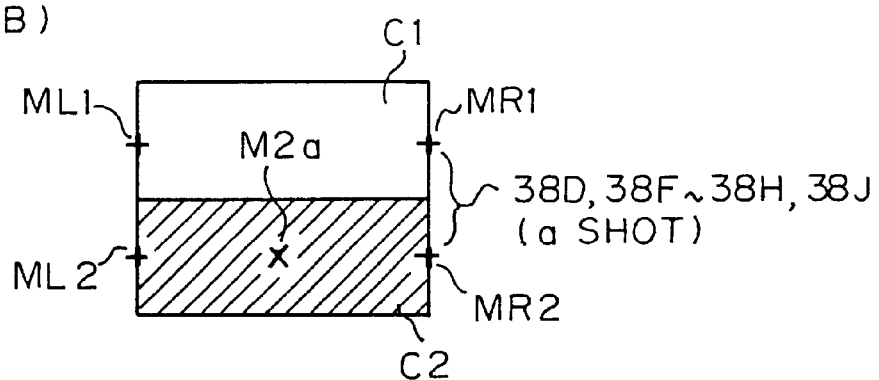
(C)
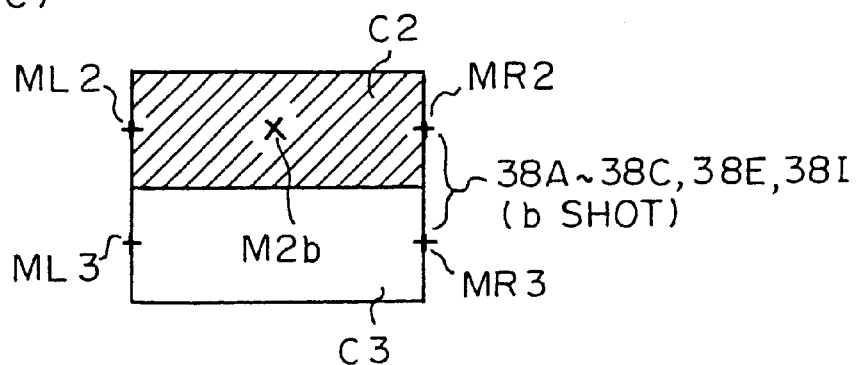

Fig. 10
(A)
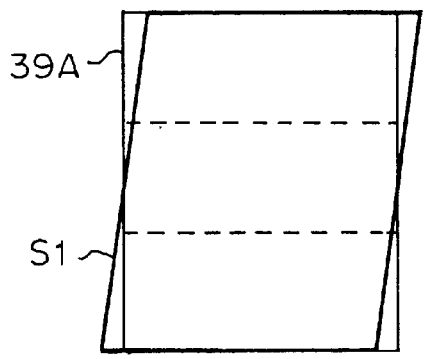
(B)
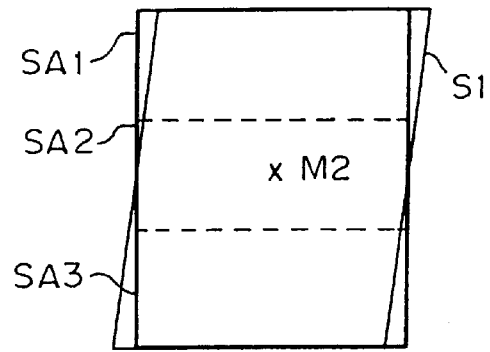
(C)
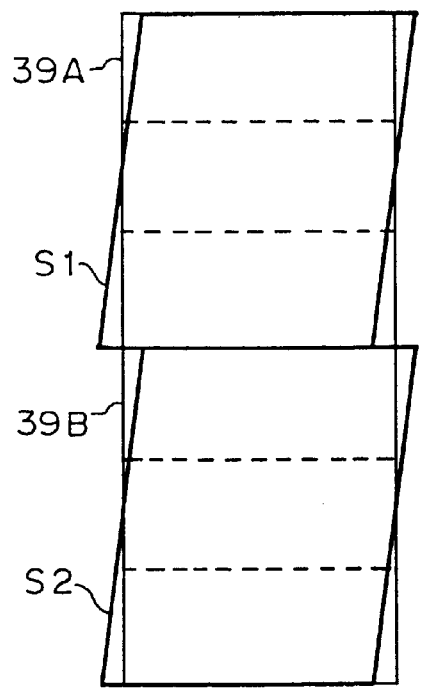
(D)
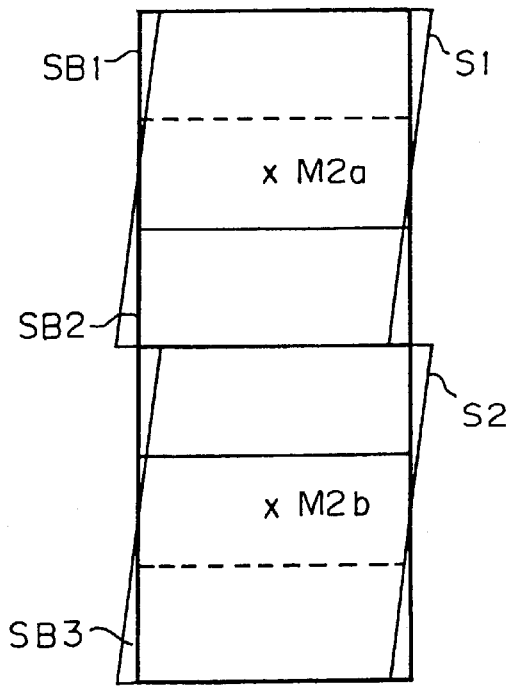

Fig. 12
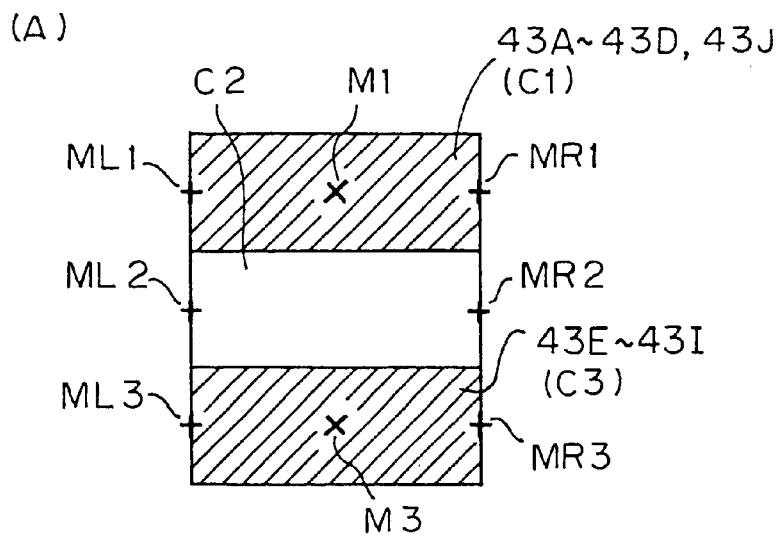
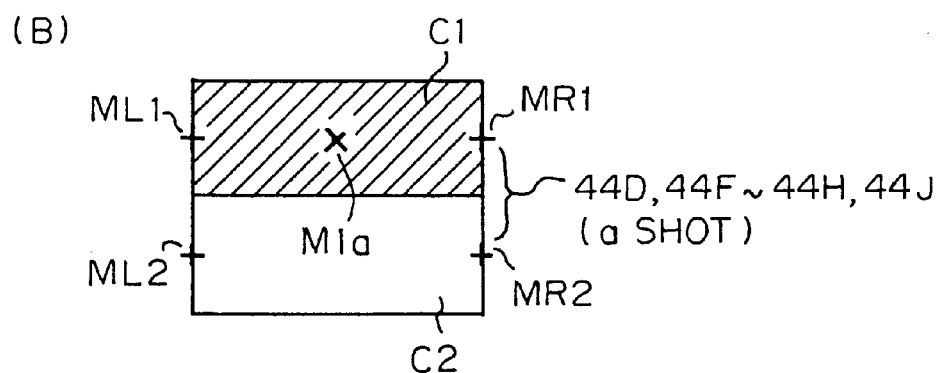
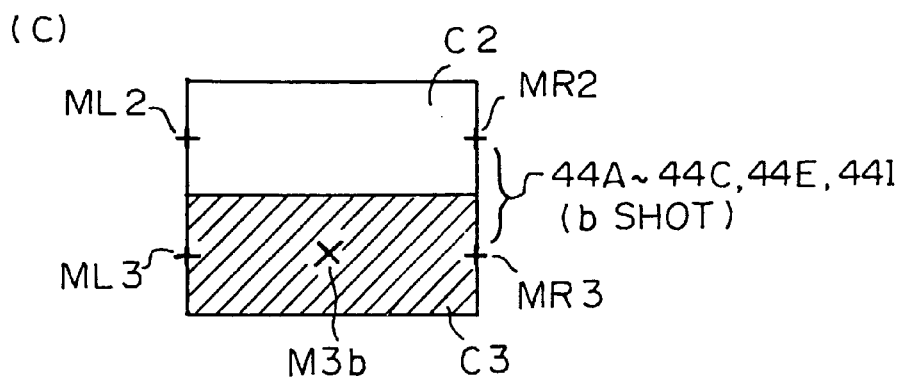

Fig. 13
(A)
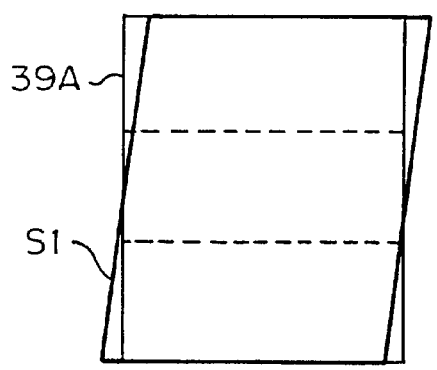
(B)
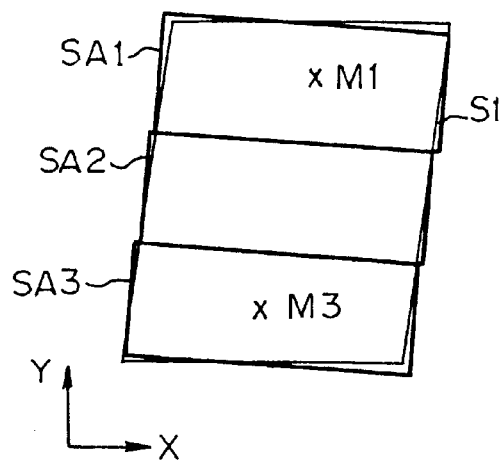
(C)
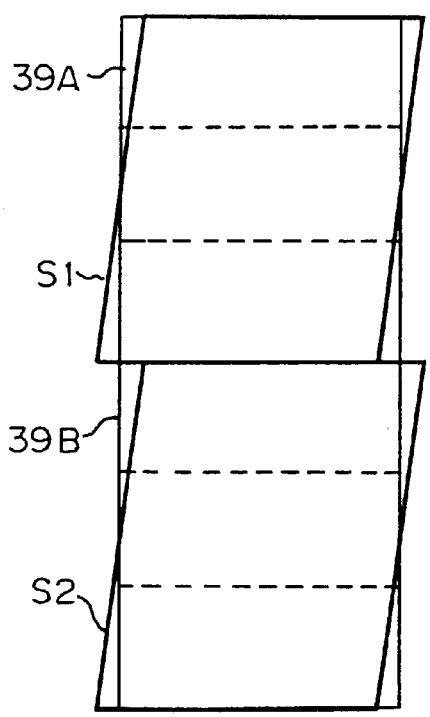
(D)
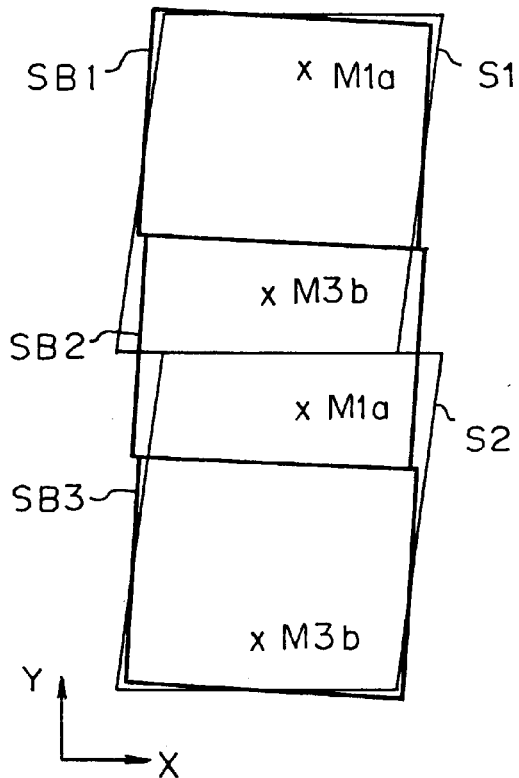

EXPOSURE METHOD

CROSS REFERENCE TO RELATED APPLICATION

This application is a Continuation of prior application Ser. No. 09/024,105, filed Feb. 17, 1998, now abandoned which is a Continuation-in-Part of prior application Ser. No. 08/654,419 filed May 28, 1996 (now Abandoned).

BACKGROUND OF THE INVENTION

The present invention relates to an exposure method in a photolithography process for producing, for example, semiconductor devices or liquid crystal displays, wherein mask patterns are overlaid on one another on a substrate, such as a wafer, using two exposure apparatuses having respective exposure fields of different sizes. The exposure method of the present invention is especially advantageous when applied to exposure by the mix-and-match method in which exposure of a critical layer is carried out by a projection exposure apparatus of a scanning exposure type.

In factories for producing semiconductor devices, such as ultra LSIs, from the viewpoint of improving the throughput (productivity) of the production process, there has been an increasing tendency to use different exposure apparatuses for carrying out exposure of different layers on a wafer in a process for producing a single type of semiconductor devices. As a method for effecting exposure of different layers on a wafer by using different exposure apparatuses, there can be mentioned a so-called mix-and-match method disclosed in, for example, Unexamined Japanese Patent Application Public Disclosure No. 62-90931, in which exposure of a critical layer which requires high resolution is effected by a first one-shot exposure type projection exposure apparatus (stepper) having a high reduction ratio, and exposure of a rough layer which does not require high resolution as compared to the critical layer is effected by a second one-shot exposure type projection exposure apparatus (stepper) having a low reduction ratio.

In the mix-and-match method, for example, when the size of the exposure field of the second projection exposure apparatus is twice that of the first projection exposure apparatus in both vertical and horizontal directions, the throughput of the exposure process for the rough layer is four times that for the critical layer. However, when the size of exposure field (i.e., the size of shot area) is different between the first projection exposure apparatus and the second projection exposure apparatus, it is difficult to achieve a satisfactorily high overlay accuracy. Therefore, in the conventional mix-and-match method in which exposure of the critical layer is effected by a projection exposure apparatus with a small exposure field, which has high resolution and small distortion, and exposure of the rough layer is effected by a projection exposure apparatus with a large exposure field, which has relatively low resolution and relatively large distortion but offers a high throughput, various alignment methods have been attempted to achieve a high overlay accuracy.

As mentioned above, in the conventional mix-and-match method, exposure of the rough layer is effected using a stepper having a large exposure field, in order to increase the throughput.

Recently, in producing semiconductor devices, it is desired to not only improve the resolution of the stepper for transferring a mask pattern having a small line width but also increase a unit chip size. For improving the resolution of the stepper, the conventional stepper utilizing an i-line of a mercury lamp (wavelength: 365 nm) as exposure light is unsatisfactory. Because light having a short wavelength is effective for achieving high resolution, an excimer laser beam having a wavelength in an ultraviolet range, such as a KrF excimer laser beam (wavelength: 365 nm) and an ArF excimer laser beam (wavelength: 193 nm), is recently used as exposure light, instead of the i-line.

On the other hand, when it is attempted to increase the size of a projection optical system of the stepper for increasing the size of the exposure field, it is difficult to design and produce a projection optical system for one-shot exposure having a large size. Further, when the excimer laser beam having a wavelength in an ultraviolet range is used, vitreous materials which can be used for lenses for the projection optical system are limited to quartz or fluorite, so that it is difficult to suppress various aberrations in a large image-forming area within predetermined allowable ranges, leading to difficulty in increasing the size of the projection optical system.

In such a situation, for effecting exposure of high resolution using a projection exposure apparatus having a large exposure field (i.e., a large shot area) without increasing the size of a projection optical system of the projection exposure apparatus, it has been proposed to employ a step-and-scan type projection exposure apparatus in which a reticle and a wafer are synchronously moved in scanning directions at respective predetermined speeds, relative to a projection optical system, to thereby transfer a pattern on the reticle to each of shot areas on the wafer. When exposure is effected by a scanning exposure type projection exposure apparatus, such as the step-and-scan type projection exposure apparatus, a magnitude of distortion in the exposure field is suppressed by about 40% as compared to the one-shot exposure type projection exposure apparatus, as disclosed in Unexamined Japanese Patent Application Public Disclosure No. 6-349702.

Recently, it has been strongly desired to achieve a high overlay accuracy with respect to exposure of the rough layer. Therefore, in exposure by the mix-and-match method, it has been attempted to effect exposure of the critical layer by the scanning exposure type projection exposure apparatus with a large exposure field utilizing an excimer laser beam, which has high resolution and small distortion, and effect exposure of the rough layer by the one-shot exposure type projection exposure apparatus utilizing the i-line, which has conventionally been used for exposure of the critical layer.

In this case, however, exposure of the critical layer is effected by a projection exposure apparatus having a large exposure field and exposure of the rough layer is effected by a projection exposure apparatus having a small exposure field. Therefore, various alignment methods in the conventional mix-and-match method in which exposure of the critical layer is effected by a projection exposure apparatus having a small exposure field and exposure of the rough layer is effected by a projection exposure apparatus having a large exposure field are unsatisfactory for achieving a high overlay accuracy.

In addition, from the viewpoint of efficiency, the exposure field of the scanning exposure type projection exposure apparatus has a rectangular form which is long in the scanning direction and the exposure field of the one-shot exposure type projection exposure apparatus has, for example, a square form, so that the length in the scanning direction of the exposure field of the scanning exposure type projection exposure apparatus may be a multiple of a non-integer (e.g., a half-integer, such as 3/2) of the width of the exposure field of the one-shot exposure type projection exposure apparatus. When the size of the exposure field for exposure of the critical layer is a multiple of a non-integer of the size of the exposure field for exposure of the rough layer, there is a shot area in the rough layer which extends over a plurality of shot areas in the critical layer, leading to difficulty in achieving a high overlay accuracy.

BRIEF SUMMARY OF THE INVENTION

In view of the above, the present invention has been made. It is an object of the present invention to provide an exposure method for effecting exposure by the mix-and-match method utilizing two exposure apparatuses having respective exposure fields of different sizes, in which a high overlay accuracy can be achieved, even when, as compared to the exposure field for first exposure, the exposure field for subsequent exposure is small.

It is another object of the present invention to provide an exposure method for effecting exposure by the mix-and-match method, in which a high overlay accuracy can be achieved, even when the length in a predetermined direction of the exposure field for first exposure is a multiple of a non-integer of that of the exposure field for subsequent exposure.

According to the present invention, there is provided an exposure method for effecting exposure by transferring a first mask pattern to a substrate in each of shot areas in a first shot array thereon using a first exposure apparatus having a predetermined exposure field size and transferring a second mask pattern to the substrate in each of shot areas in a second shot array thereon using a second exposure apparatus having an exposure field size different from the exposure field size of the first exposure apparatus, comprising the steps of:

transferring the first mask pattern and alignment arks to the substrate in each of the shot areas in the first shot array using the first exposure apparatus;

selecting predetermined alignment marks to be measured from the alignment marks transferred to the substrate, based on the exposure field size of the first exposure apparatus and information on the first shot array;

conducting alignment of shot areas for the second shot array, based on respective positions of the predetermined alignment marks to be measured; and transferring the second mask pattern to the substrate in each of the shot areas in the second shot array using the second exposure apparatus.

In the present invention, for example, as shown in FIG. 3(A) and FIG. 3(B), when a wafer in the exposure apparatus is two-dimensionally movable in an X direction and a Y direction, the size in the X direction of the exposure field (S1) of the first exposure apparatus is i times that of the exposure field (each of SA1 to SA3) of the second exposure apparatus and the size in the Y direction of the exposure field (S1) of the first exposure apparatus is i times that of the exposure field (each of SA1 to SA3) of the second exposure apparatus (each of i and j is an integer of j or more, wherein at least one of i and j is an integer of 2 or more). When exposure is effected by the first exposure apparatus to thereby form a first shot array (S1, S2, S3, . . . ) shown in, for example, FIG. 7(A), alignment marks are transferred with respect to each chip pattern which is the smallest repetition unit in the shot array. Thereafter, in order to effect exposure by the second exposure apparatus so as to form a second shot array (SA1, SA2, SA3, . . . ) shown in, for example, FIG. 7(B), a shot area (each of 37A to 37J) in the second shot array which is positioned in a central portion of each shot area in the first shot array is selected as a sample shot, and alignment between the shot areas in the first shot array and shot areas for the second shot array is conducted, based on the respective positions of alignment marks included in each sample shot. Thus, with respect to the first shot array, array errors and in-shot errors are separated, so that both the array errors and the in-shot errors in the first shot array can be satisfactorily corrected, to thereby achieve a high overlay accuracy.

Further, in the present invention, for example, as shown in FIG. 3(C) and FIG. 3(D), when the size in a predetermined array direction (Y direction)of the exposure field (each of S1 and S2) of the first exposure apparatus is a multiple of a non-integer (e.g., a half-integer) of that of the exposure field (each of SB1, SB2 and SB3) of the second exposure apparatus, for effecting exposure by the second exposure apparatus, for example, as shown in FIG. 7(C) and FIG. 7(D), there are shot areas (such as SB19) in the second shot array which extend over borders between shot areas in the first shot array. In this case, it is preferred to select a plurality of pairs of shot areas (such as 38J and 38I) from the shot areas in the second shot array, the plurality of pairs of shot areas having therebetween in the array direction the shot areas (such as SB19) in the second shot array which extend over borders between shot areas in the first shot array, and to select alignment marks included in predetermined shot areas (38A to 38J) of the plurality of pairs of shot areas.

Each of the shot areas (such as SB19) in the second shot array which extend over borders between shot areas in the first shot array is not selected as the sample shot because it is affected by in-shot errors of two shot areas in the first shot array. Thus, the alignment marks are selected from the shot areas having therebetween the shot areas (such as SB19) which extend over borders between shot areas in the first shot array so that the alignment marks are substantially symmetrically positioned. This makes it possible to accurately evaluate in-shot errors in the first shot array, thereby minimizing an overlay error. The shot areas in the second shot array having therebetween the shot areas (such as SB19) which extend over borders between shot areas in the first shot array may include one of a pair of shot areas (such as 38G and 38B) shown in FIG. 7(D).

Further, in the present invention, it is more preferred to conduct alignment in the following manner. That is, when alignment marks are transferred to the substrate by using the first exposure apparatus, a plurality of alignment marks (ML1 to ML3, MR1 to MR3) are transferred with respect to each of chip patterns (C1 to C3) to be transferred to the substrate in each of the shot areas (S1 to SN) in the first shot array. For effecting exposure of the rough layer by using the second exposure apparatus, a plurality of predetermined sample shots are selected from the shot areas in the second shot array and a plurality of alignment marks to be measured are selected from the alignment marks included in each of the plurality of predetermined sample shots. Subsequently, 6 parameter values corresponding to linear array errors (scaling parameters $R_x$ and $R_y$, a wafer rotation angle $\Theta$, a perpendicularity error $\Omega$ and offsets $O_x$ and $O_y$) and 4 parameter values corresponding to in-shot linear errors (shot magnifications $r_x$ and $r_y$, a shot rotation angle $\theta$ and an in-shot perpendicularity error $\omega$) are calculated, with respect to the first shot array, based on respective positions of the plurality of alignment marks to be measured. Using these 10 parameters, alignment of shot areas for the second shot array is conducted.

In order to accurately calculate the above-mentioned 10 parameter values, at least 3 sample shots are selected from the first shot array and two-dimensional positions of alignment marks at at least two positions in each sample shot are measured, followed by application of the least square method to the measurement values. For effecting exposure by the second exposure apparatus, array errors are corrected, based on the above-mentioned 6 parameters corresponding to linear array errors, and a magnification error in the exposure field and a shot rotation angle are corrected, based on the above-mentioned 4 parameters corresponding to in-shot linear errors, to thereby achieve a high overlay accuracy. Further, a perpendicularity error in the scanning direction, which is likely to occur in the canning exposure type projection exposure apparatus, can also be corrected to some extent.

Further, when one lot of substrates are successively subjected to exposure by the second exposure apparatus, 4 parameter values corresponding to in-shot errors are calculated and stored with respect to first several substrates and, for exposure of the remaining substrates, 6 parameter values corresponding to linear array errors are calculated by, for example, measuring the position of an alignment mark at one position in each sample shot selected from the first shot array. Alignment is conducted, based on the calculated 6 parameter values and the stored 4 parameter values. Thus, not only can the throughput of the production process be improved, but also a high overlay accuracy can be achieved.

In the present invention, it is preferred that the first exposure apparatus be a scanning exposure type projection exposure apparatus adapted to transfer a pattern on a mask to a substrate in each of shot areas thereon by moving the mask and the substrate synchronously and the second exposure apparatus be a one-shot exposure type projection exposure apparatus adapted to transfer a pattern on a mask to a substrate in each of shot areas thereon by one-shot exposure. In the scanning exposure type projection exposure apparatus, errors in positions of alignment marks are suppressed, as compared to the one-shot exposure type projection exposure apparatus, so that when exposure of the critical layer is effected by the scanning exposure type projection exposure apparatus, a high overlay accuracy can be achieved.

Further, according to the present invention, there is provided an exposure method comprising the steps of:
 transferring a first mask pattern to a first layer on a substrate using a first exposure apparatus, the mask pattern containing a plurality of marks;
 selecting predetermined marks from the plurality of marks transferred to the first layer, based on exposure data with respect to a plurality of shot areas formed on the first layer by the first exposure apparatus;
 conducting alignment of the substrate, based on respective positions of the selected predetermined marks; and
 transferring a second mask pattern to a second layer on the substrate using a second exposure apparatus.

The foregoing and other objects, features and advantages of the present invention will be apparent from the following detailed description and appended claims taken in connection with the accompanying drawings.

BRIEF DESCRIPTION OF THE SEVERAL VIEW OF THE DRAWINGS

FIG. 1(A) is a schematic illustration showing a construction of a scanning type exposure apparatus.

FIG. 1(B) is a plan view of a reticle for the scanning type exposure apparatus of FIG. 1(A).

FIG. 2(A) is a schematic illustration showing a onstruction of a one-shot type exposure apparatus.

FIG. 2(B) is a plan view of a reticle for the one-shot ype exposure apparatus of FIG. 2(A).

FIG. 3(A) is a plan view showing a shot area of the scanning type exposure apparatus, which contains a three (1×3)-chip pattern.

FIG. 3(B) is a plan view showing three shot areas of the one-shot type exposure apparatus, each containing a single (1×1)-chip pattern, which are successively formed by moving the wafer in a stepwise manner.

FIG. 3(C) is a plan view showing two shot areas of the scanning type exposure apparatus, each containing a three (1×3)-chip pattern, which are successively formed by moving the wafer in a stepwise manner.

FIG. 3(D) is a plan view showing three shot areas of the one-shot type exposure apparatus, each containing a two(1×2)-chip pattern, which are successively formed by moving the wafer in a stepwise manner.

FIG. 3(E) is an enlarged plan view of an example of a wafer mark.

FIG. 6(A) is an illustration showing how a shot rotation occurs in each shot area in FIG. 4(A).

FIG. 6(B) is an illustration showing an overlay condition achieved by exposure after alignment using the sample shots in FIG. 5(A).

FIG. 6(C) is an illustration showing how a shot rotation occurs in each shot area in FIG. 4(C).

FIG. 6(D) is an illustration showing an overlay condition achieved by exposure after alignment using the sample shots in FIG. 5(C).

FIG. 7(A) shows positions of sample shots in the first layer according to one example of an embodiment of the present invention, which are selected for the second layer of FIG. 4(B) in consideration of information on the first layer.

FIG. 7(B) shows positions of the sample shots of FIG. 7(A) in the second layer.

FIG. 7(C) shows positions of sample shots in the first layer according to another example of the embodiment of the present invention, which are selected for the second layer of FIG. 4(D) in consideration of information on the first layer.

FIG. 7(D) shows positions of the sample shots of FIG. 7(C) in the second layer.

FIG. 8(A) is an enlarged view of each sample shot in FIG. 7(B).

FIG. 8(B) is an enlarged view showing an a shot in each sample shot in FIG. 7(D).

FIG. 8(C) is an enlarged view showing a b shot in each sample shot in FIG. 7(D).

FIG. 10(A) is an illustration showing how a shot perpendicularity error occurs in each shot area in FIG. 4(A).

FIG. 10(B) is an illustration showing an overlay condition achieved by exposure after alignment using the ample shots of FIG. 8(A).

FIG. 10(C) is an illustration showing how a shot perpendicularity error occurs in each shot area in FIG. 4(C).

FIG. 10(D) is an illustration showing an overlay condition achieved by exposure after alignment using the sample shots of FIG. 8(B) and FIG. 8(C).

FIG. 12(A) is an enlarged view of each sample shot in FIG. 11(B).

FIG. 12(B) is an enlarged view showing an a shot in each sample shot in FIG. 11(D).

FIG. 12(C) is an enlarged view showing a b shot in each sample shot in FIG. 11(D).

FIG. 13(A) is an illustration showing how a shot perpendicularity error occurs in each shot area in FIG. 4(A).

FIG. 13(B) is an illustration showing an overlay ondition achieved by exposure after alignment using the sample shots of FIG. 12(A).

FIG. 13(C) is an illustration showing how a shot perpendicularity error occurs in each shot area in FIG. 4(C).

FIG. 13(D) is an illustration showing an overlay condition achieved by exposure after alignment using the sample shots of FIG. 12(B) and FIG. 12(C).

DETAILED DESCRIPTION OF THE INVENTION

Figure 4:
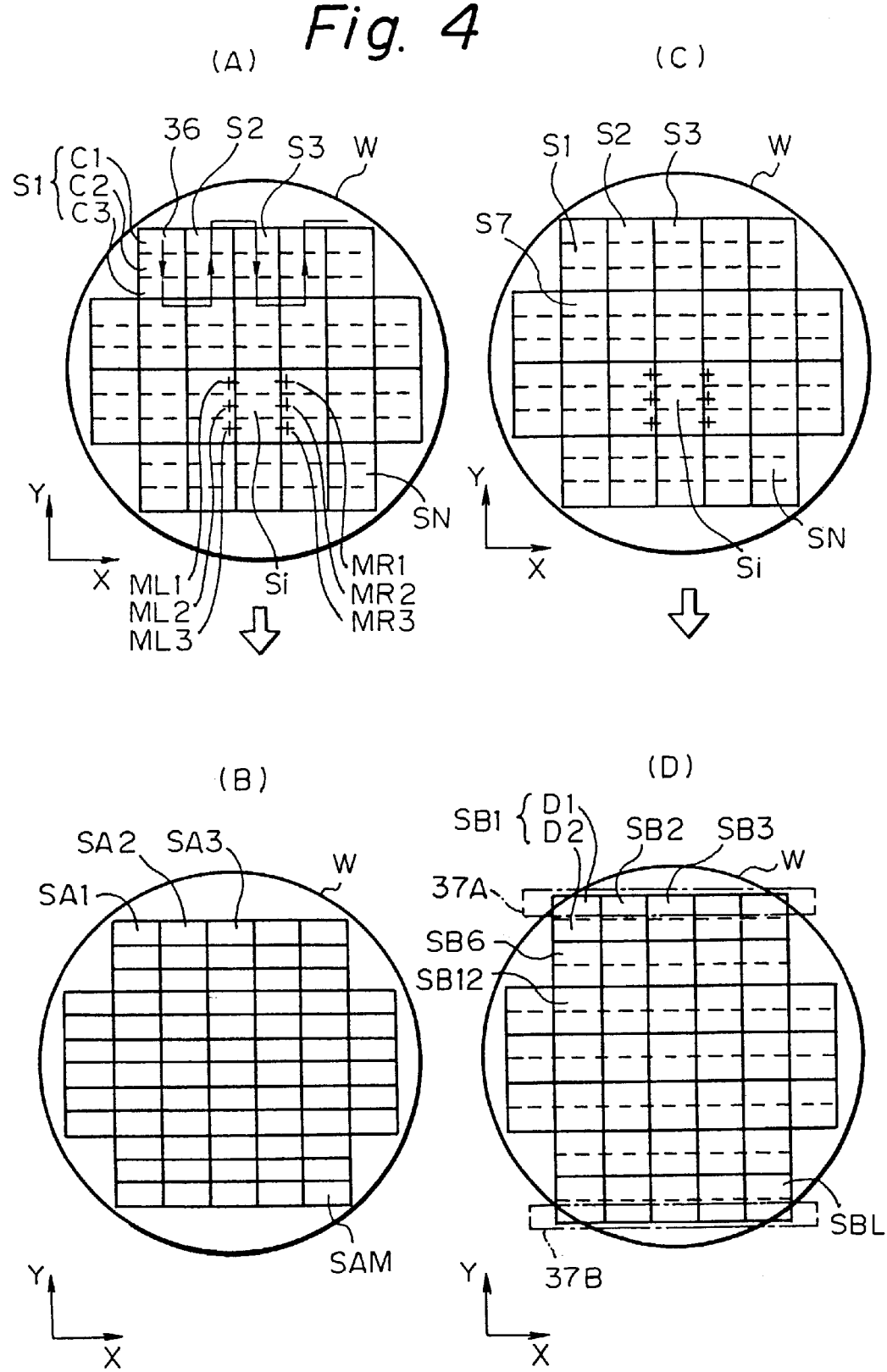
FIG. 4(A) shows an example of a shot map for exposure of a first layer on a wafer by the scanning type exposure apparatus.
FIG. 4(B) shows an example of a shot map for exposure of a second layer on a wafer by the one-shot type exposure apparatus having an exposure field of a single-chip size.
FIG. 4(C) shows a shot map which is identical to the shot map of FIG. 4(A).
FIG. 4(D) shows an example of a shot map for exposure of a second layer on a wafer by the one-shot type exposure apparatus having an exposure field of a two-chip size.

Hereinbelow, an embodiment of the present invention is explained, with reference to the drawings.

In FIG. 1(A), reference numeral 1 denotes a step-and-scan type projection exposure apparatus (hereinafter, frequently referred to simply as "scanning type exposure apparatus") as a first exposure apparatus used in the method of the present invention. Reference numeral 2 denotes an illumination optical system mainly comprising: an excimer laser light source including a KrF excimer laser or an ArF excimer laser; a fly-eye lens for obtaining a uniform distribution of illuminance of exposure light (a laser beam in this embodiment) from the light source; a field stop; and a condenser lens. During exposure using the scanning type exposure apparatus 1 shown in FIG. 1(A), exposure light IU1 emitted from the illumination optical system 2 illuminates a slit-shaped illumination area 13 on a reticle 3. A pattern in the illumination area 13 is projected through a projection optical system 4 having a projection magnification $\beta 1$ ($\beta 1$ is, for example, ¼ or ⅕) to a photoresist-coated wafer W. In the following explanation, a Z-axis is taken in a direction parallel to the optical axis of the projection optical system 4 and a plane perpendicular to the Z-axis contains an X-axis and a Y-axis. The X-axis is taken in a direction perpendicular to the plane of FIG. 1(A) and the Y-axis is taken in a direction parallel to the plane of FIG. 1(A)(i.e., the scanning direction in the scanning type exposure apparatus 1).

The reticle 3 is held on a reticle stage 5 which is provided on a reticle base 6. The reticle stage 5 is adapted to perform continuous movement (scanning movement) in the Y direction and slight movement in the X direction, the Y direction and a rotation direction. A laser interferometer 7 measures the position of the reticle stage 5. Information on the measured position is supplied to a main controller 8 which is adapted to comprehensively control the operation of the entire scanning type exposure apparatus 1, and the main controller 8 controls alignment of the reticle stage 5 (i.e., alignment of the reticle 3) and the scanning movement of the reticle stage 5 (i.e., the scanning movement of the reticle 3) in the Y direction. The wafer W is held by a wafer holder (not shown) on a Z stage 9 which is adapted to control the position of the wafer W in the Z direction, and a rotation angle and a tilt angle of the wafer W. The Z stage 9 is provided on an XY stage 10. The XY stage 10 is adapted to perform continuous movement (scanning movement) and stepping in the Y direction and stepping in the X direction. A laser interferometer 11 measures the position of the Z stage 9 (i.e., the position of the wafer W). Information on the measured position is supplied to the main controller 8, and the main controller 8 controls alignment of the XY stage 10 (i.e., alignment of the wafer W) and the scanning movement of the XY stage 10 (i.e., the scanning movement of the wafer W) in the Y direction.

FIG. 1(B) is a plan view of the reticle 3 shown in FIG. 1(A). As shown in FIG. 1(B), the slit-shaped illumination area 13 is a part of a pattern area 14 on the reticle 3. The illumination area 13 is inscribed in a circular effective field IF1 of the projection optical system 4. During exposure, the reticle stage 5 is moved so that the reticle 3 is moved in the +Y (or -Y) direction at a predetermined speed $V_R$, relative to the illumination area 13. On the other hand, the XY stage 10 is moved so that the wafer W is moved in the -Y (or +Y) direction at a speed $\beta 1 V_R$, synchronously with the movement of the reticle 3. Thus, an entire pattern in the pattern area 14 which is larger than the illumination area 13 is transferred to each of shot areas on the wafer W. A slit-shaped exposure area on the wafer W which is in a conjugate relationship to the slit-shaped illumination area 13 on the reticle 3 is called "illumination field" of the projection optical system 4. The area of an image of the entire pattern in the pattern area 14, which image is formed on the wafer W by exposure, that is, the area on the wafer W which is in a conjugate relationship to the pattern area 14 on the reticle 3 is called "exposure field" of the projection optical system 4. The size of each shot area formed on the wafer W is equal to the size of the exposure field of the projection optical system 4.

A plurality of alignment marks, together with a circuit pattern, are formed in the pattern area 14 on the reticle 3. When the circuit pattern is transferred to the wafer W, these alignment marks are also transferred to the wafer W. The images of alignment marks formed on the wafer W serve as alignment marks (wafer marks) for another layer on the wafer W which is subsequently exposed. Incidentally, in FIG. 1(A), as an example of an alignment sensor provided in the scanning type exposure apparatus 1, an alignment sensor 12 of an off-axis and image-processing type is provided in the scanning type exposure apparatus 1.

In FIG. 2(A), reference numeral 21 denotes a one-shot exposure type projection exposure apparatus (hereinafter, frequently referred to simply as "one-shot type exposure apparatus") comprising a stepper as a second exposure apparatus used in the method of the present invention. Reference numeral 22 denotes an illumination optical system mainly comprising: a super-high pressure mercury lamp; an optical filter for selecting, for example, an i-line from an emission line from the mercury lamp; a fly-eye lens for obtaining a uniform illuminance distribution; a variable field stop (reticle blind); and a condenser lens. During exposure using the one-shot type exposure apparatus 21 shown in FIG. 2(A), exposure light IU2 emitted from the illumination optical system 22 illuminates an illumination area 33 on a reticle 23. A pattern in the illumination area 33 is projected through a projection optical system 24 having a projection magnification $\beta 2$ ($\beta 2$ is, for example, ¼ or ⅕) to a photoresist-coated wafer W. In the following explanation with respect to the one-shot type exposure apparatus 21, a Z-axis is taken in a direction parallel to the optical axis of the projection optical system 24 and a plane perpendicular to the Z-axis contains an X-axis and a Y-axis. The X-axis is taken in a direction perpendicular to the plane of FIG. 2(A) and the Y-axis is taken in a direction parallel to the plane of FIG. 2(A).

The reticle 23 is held on a reticle stage 25. The reticle stage 25 is adapted to perform slight movement of the reticle 23 in the X direction, the Y direction and a rotation direction. A laser interferometer (not shown) measures the position of the reticle stage 25 (i.e., the position of the reticle 23). Information on the measured position is supplied to a main controller 28 which is adapted to comprehensively control the operation of the entire one-shot type exposure apparatus 21, and the main controller 28 controls alignment of the reticle stage 25 (i.e., alignment of the reticle 23). The wafer W is held by a wafer holder (not shown) on a Z stage 29. The Z stage 29 is provided on an XY stage 30. The XY stage 30 is adapted to perform stepping of the Z stage 29 (stepping of the wafer W) in the X direction and the Y direction. A laser interferometer 31 measures the position of the Z stage 29 (i.e., the position of the wafer W). Information on the measured position is supplied to the main controller 28, and the main controller 28 controls alignment of the XY stage 30.

FIG. 2(B) is a plan view of the reticle 23 shown in FIG. 2(A). As shown in FIG. 2(B), a pattern area on the reticle 23 substantially coincides with the illumination area 33, which is generally rectangular. The illumination area 33 is inscribed in a circular effective field IF2 of the projection optical system 24. During exposure, while both the reticle 23 and the wafer W are stopped, a pattern in the illumination area 33 is transferred to each of shot areas on the wafer W. In the one-shot type exposure apparatus 21 in which the pattern area on the reticle 23 substantially coincides with the illumination area 33, an exposure area on the wafer W which is in a conjugate relationship to the illumination area 33 on the reticle 23 becomes the exposure field of the projection optical system 24. Therefore, when the projection optical system 4 of the scanning type exposure apparatus 1 and the projection optical system 24 of the one-shot type exposure apparatus 21 have the same projection magnification and the same size of effective field, the exposure field of the scanning type exposure apparatus 1 is larger than the exposure field of the one-shot type exposure apparatus 21. As an example of an alignment sensor provided in the one-shot type exposure apparatus 21 of FIG. 2(A), an alignment sensor 32 of an off-axis type and image-processing type is provided in the one-shot type exposure apparatus 21. The alignment sensor 32 detects the positions of the wafer marks and information on the detected positions of the wafer marks is supplied to the main controller 28. Based on the detected positions of the wafer marks, the main controller 28 conducts alignment between the reticle 23 and each of shot areas on the wafer W by, for example, the enhanced global alignment (EGA) method which is explained later.

In this embodiment, exposure is effected by the mix-and-match method. Illustratively stated, exposure in this embodiment is effected as follows. The circuit pattern and alignment marks on the reticle 3 are transferred to a first layer on the wafer W using the scanning type exposure apparatus 1. The resultant wafer W is subjected to various treatments, such as development, and coated with a photoresist, followed by effecting exposure of a second layer on the wafer W using the one-shot type exposure apparatus 21. As mentioned above, in the scanning type exposure apparatus 1, a magnitude of distortion in the exposure field is suppressed by about 40%, as compared to the one-shot type exposure apparatus 21, as described in Unexamined Japanese Patent Application Public Disclosure No. 6-349702. Therefore, when exposure of the first layer is effected by the scanning type exposure apparatus 1, the wafer marks are accurately positioned, so that an overlay accuracy becomes high.

In this embodiment, the reticle used in the scanning type exposure apparatus 1 and the reticle used in the one-shot type exposure apparatus 21 have the same size. For example, the projection magnification $\beta 1$ of the scanning type exposure apparatus 1 is set to ¼ and the projection magnification $\beta 2$ of the one-shot type exposure apparatus 21 is set to ⅕ so that both the reticles 3 and 23 are of a 6-inch type. Consequently, with respect to the size of the exposure field of the scanning type exposure apparatus 1, the width in the X direction is 26 to 30 mm and the width in the Y direction (the scanning direction) is 33 mm. With respect to the size of the exposure field of the one-shot type exposure apparatus 21, the exposure field is about 22 mm square. Further, in this embodiment, each chip pattern as the smallest unit of semiconductor device formed on the wafer W has a rectangular form of 22 mm width (in the X direction)×11 mm width (in the Y direction) and the size of the exposure field of the scanning type exposure apparatus 1 is set to 22 mm width (in the X direction)×33 mm width (in the Y direction) so that three chip patterns can be transferred to each shot area. With respect to the one-shot type exposure apparatus 21, the exposure field is set to a 22-mm square so that two chip patterns can be transferred to each shot area. However, in the one-shot type exposure apparatus 21, it is possible to transfer a single chip pattern to each shot area by limiting the visual field using the variable field stop so that the size of the exposure field is set to 22 mm width (in the X direction)×11 mm width (in the Y direction). That is, in this embodiment, the size of the exposure field of the one-shot type exposure apparatus 21 may be a single-chip size or a two-chip size.

FIG. 3(A) shows a shot area S1 in the first layer which is formed by exposure using the scanning type exposure apparatus 1 having the above-mentioned exposure field. As shown in FIG. 3(A), the shot area S1 has a rectangular form having a width XA in the X direction and a width YA in the Y direction (the scanning direction) which is longer than the width XA. Three identical chip patterns (accurately, circuit patterns in the first layers of three identical chip patterns) C1, C2 and C3, which are arrayed in the Y direction, are formed in the shot area S1. In other words, the shot area S1 is a shot area of a three(1×3)-chip size comprising a single column in the X direction and three rows in the Y direction. In this embodiment, the width XA is 22 mm and the width YA is 33 mm. Three pairs of wafer marks MR1 and ML1, MR2 and ML2 and MR3 and ML3 are formed in the shot area S1 so that a pair of wafer marks are formed on the right and left of each of the chip patterns C1, C2 and C3. These wafer marks MR1 to MR3 and ML1 to ML3 are two-dimensional marks which are identical to each other. For example, as shown in FIG. 3(E), the wafer mark MR1 comprises a line-and-space pattern 35X of a concave-convex shape in which three lines are arrayed in a spaced relationship in the X direction and a line-and-space pattern 35Y of a concave-convex shape in which three lines are arrayed in a spaced relationship in the Y direction. Using these wafer marks, alignment between shot areas in the first layer and shot areas for the second layer is conducted.

FIG. 3(B) shows shot areas SA1, SA2 and SA3 which are overlaid on the shot area S1 of FIG. 3(A) by exposure using the one-shot type exposure apparatus 21 having an exposure field of a single-chip size. Each of the shot areas SA1 to SA3 has a width XB in the X direction and a width YB in the Y direction. As shown in FIG. 3(B), the width XB is equal to the width XA of the shot area S1 and the width YB is ⅓ of the width YA of the shot area S1. That is, when exposure is effected three times using the one-shot type exposure apparatus 21 having an exposure field of a single-chip size, while performing stepping of the wafer W in the Y direction each time, three chip pattern images corresponding to the shot areas SA1 to SA3 are overlaid on the shot area S1. In this instance, with respect to the size of the exposure field (shot area) of the scanning type exposure apparatus 1, the width in the X direction is equal to that of the exposure field (shot area) of the one-shot type exposure apparatus 21 and the width in the Y direction is three times that of the exposure field (shot area) of the one-shot type exposure apparatus 21.

FIG. 3(C) shows shot areas S1 and S2 which are formed by exposure using the scanning type exposure apparatus 1, wherein exposure is effected twice, while performing stepping of the wafer W in the Y direction each time. In FIG. 3(C), as in the case of the shot area S1 of FIG. 3(A), three pairs of wafer marks MR1 and ML1, MR2 and ML2 and MR3 and ML3 are formed in the shot area S2 so that a pair of wafer marks are formed on the right and left of each of the chip patterns C1, C2 and C3. Using these wafer marks, alignment between shot areas in the first layer and shot areas for the second layer is conducted.

FIG. 3(D) shows shot areas SB1, SB2 and SB3 which are overlaid on the shot areas S1 and S2 of FIG. 3(C) by exposure using the one-shot type exposure apparatus 21 having an exposure field of a two-chip size. Each of the shot areas SB1 to SB3 has a width XC in the X direction and a width YC in the Y direction. As shown in FIG. 3(D), the width XC is equal to the width XA and the width YC is ⅔ of the width YA. Two identical chip patterns D1 and D2 are formed in each of the shot areas SB1 to SB3. In this case, with respect to the size of the exposure field (shot area) of the scanning type exposure apparatus 1, the width in the X direction is equal to that of the exposure field (shot area) of the one-shot type exposure apparatus 21 and the width in the Y direction (the array direction of chip patterns) is 3/2 of that of the exposure field (shot area) of the one-shot type exposure apparatus 21, i.e., a multiple of a non-integer of that of the exposure field (shot area) of the one-shot type exposure apparatus 21. When the size of the exposure field of the scanning type exposure apparatus 1 is a multiple of a non-integer of that of the one-shot type exposure apparatus 21, relative to the Y direction, and the respective pattern images corresponding to the shot areas SB1 to SB3 [FIG. 3(D)] formed by the one-shot type exposure apparatus 21 are overlaid on the two shot areas S1 and S2 [FIG. 3(C)] formed by the scanning type exposure apparatus 1, the pattern image corresponding to the first shot area SB1 is overlaid on the chip patterns C1 and C2 in the shot area S1 and the pattern image corresponding to the third shot area SB3 is overlaid on the chip patterns C2 and C3 in the shot area S2. The pattern image corresponding to the second shot area SB2 is overlaid so as to extend over the shot area S1 and S2 in the Y direction. Therefore, alignment between shot areas in the first layer and shot areas for the second layer needs to be conducted in a special manner.

(I) Alignment by an in-shot two-point EGA method:

As mentioned above, the size of the exposure field of the one-shot type exposure apparatus 21 may be a single-chip size or a two-chip size. Hereinbelow, explanation is provided on a case in which exposure of the second layer on the wafer W is effected by the one-shot type exposure apparatus 21 having an exposure field of a single-chip size and a case in which exposure of the second layer on the wafer W is effected by the one-shot type exposure apparatus 21 having an exposure field of a two-chip size.

FIG. 4(A) shows an example of a shot map for transferring a pattern on the reticle 3 to the first layer on the wafer W using the scanning type exposure apparatus 1. As shown in FIG. 4(A), shot areas S1, S2, S3, . . . , SN (N=24 in this example) are formed on the wafer W at a predetermined pitch in each of the X direction and the Y direction, by moving the slit-shaped illumination field of the projection optical system 4 relative to the wafer W as indicated by a solid line 36 with arrows. The resultant wafer W is subjected to various treatments, such as development. Consequently, chip patterns C1, C2 and C3 are formed in each shot area Si (i=1 to N) on the wafer W and wafer marks MR1 and ML1, MR2 and ML2 and MR3 and ML3 are also formed on both sides of each shot area Si along the X-axis. Information on the size of the exposure field (i.e., the size of each shot area Si) of the scanning type exposure apparatus 1, the shot array in the shot map, the respective design coordinates of the wafer marks in the coordinate system on the wafer W (sample coordinate system) and the like is supplied through, for example, a host computer to the main controller 28 in the one-shot type exposure apparatus 21 used for exposure of the second layer. Alternatively, the above-mentioned information may be stored in a bar code on the reticle and read using a bar code reader in the one-shot type exposure apparatus 21, or preliminarily stored in an exposure data file for each process in each exposure apparatus. Incidentally, for the sake of convenience, FIG. 3(A) corresponds to the shot map of FIG. 4(A) and a shot map corresponding to FIG.

3(C), which is identical to the shot map of FIG. 4(A), is shown in FIG. 4(C). In the shot map of FIG. 4(C), the array of shot numbers (S1, S2, S3, . . . , SN) is changed from that in FIG. 3(C).

FIG. 4(B) shows an example of a shot map for transferring a pattern on the reticle 23 to the second layer on the wafer W using the one-shot type exposure apparatus 21 having an exposure field of a single-chip size. In FIG. 4(B), shot areas SA1, SA2, SA3, . . . , SAM (M=72 in this example) are arrayed so that three shot areas are contained in each shot area Si in the shot array shown in FIG. 4(A). One chip pattern on the reticle 23 is transferred to each shot area SAi (i=1 to M).

FIG. 4(D) shows an example of a shot map for transferring a pattern on the reticle 23 to the second layer on the wafer W using the one-shot type exposure apparatus 21 having an exposure field of a two-chip size. In FIG. 4(D), shot areas SB1, SB2, SB3, . . . , SBL (L=41 in this example) are arrayed so that three shot areas (e.g., SB1, SB6 and SB12) are contained in two successive shot areas Si (e.g., S1 and S7) along the Y-axis in the shot array shown in FIG. 4(C). Two chip patterns D1 and D2 on the reticle 23 are transferred to each shot area SBi (i=1 to L). However, in the shot map of FIG. 4(D), it is impossible to apply two successive shot areas SBi along the Y-axis to each of shot areas Si in an uppermost row and a lowermost row, so that there are fractional areas which are not overlaid on shot areas Si. Therefore, it is necessary to effect extra exposure with respect to areas 37A and 37B in upper and lower portions of the wafer W in FIG. 4(D), each having a width in the Y direction corresponding to the width in the Y direction of one chip pattern.

In this embodiment, for effecting overlay exposure with respect to the second layer on the wafer W by the one-shot type exposure apparatus 21 of FIG. 2(A) in accordance with the shot map of FIG. 4(B) or FIG. 4(D), alignment is conducted by the EGA method which is disclosed in U.S. Pat. No. 4,780,617. That is, a predetermined number of sample shots (EGA shots), which are shot areas to be measured, are selected from shot areas in the shot map of FIG. 4(B) or FIG. 4(D) and the position of a predetermined wafer mark included in each sample shot is detected by the alignment sensor 32 shown in FIG. 2(A).

Figure 5:
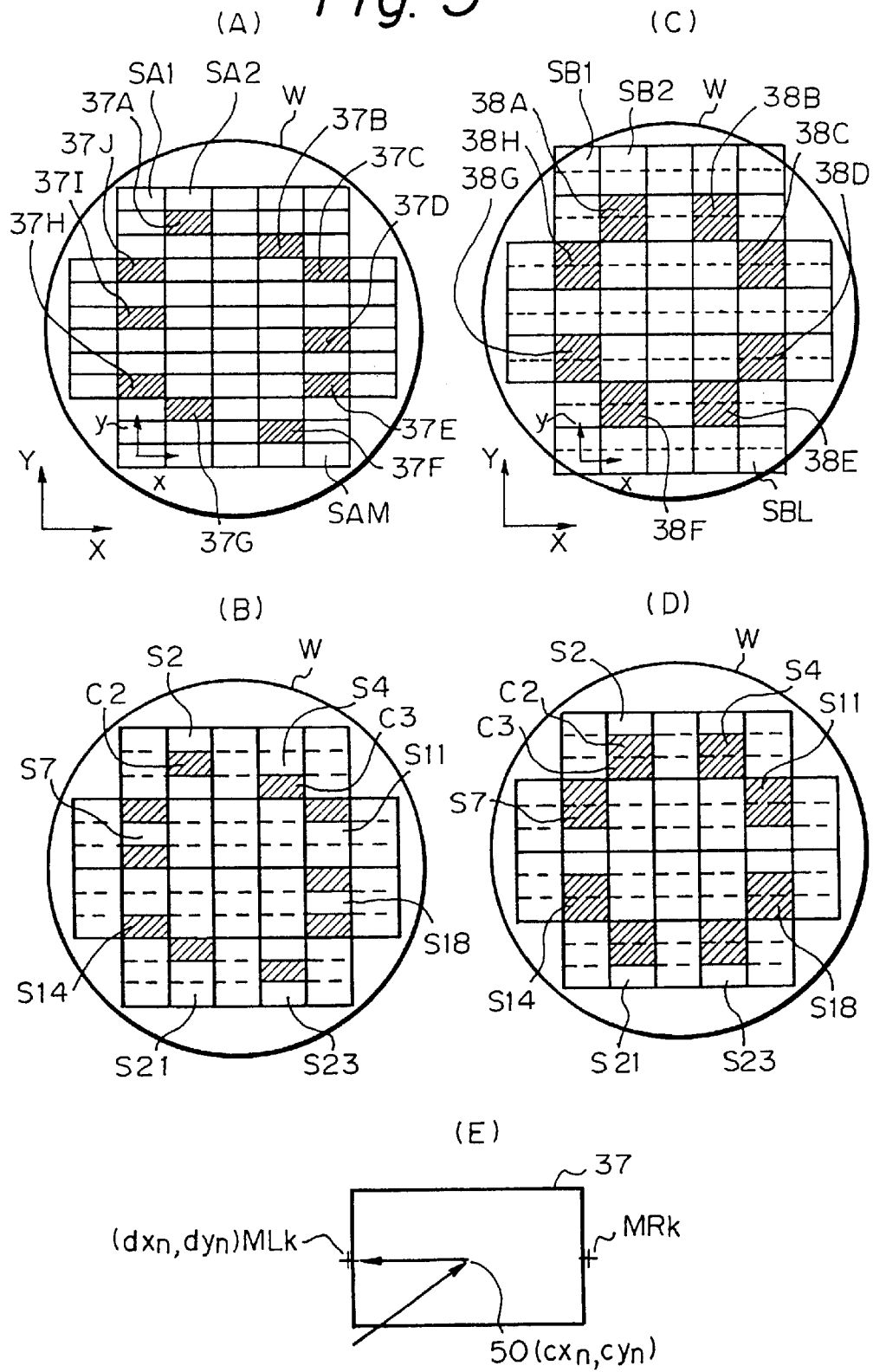
FIG. 5(A) shows examples of sample shots randomly selected for the second layer of FIG. 4(B).
FIG. 5(B) shows positions of the sample shots of FIG. 5(A) in the first layer.
FIG. 5(C) shows examples of sample shots randomly selected for the second layer of FIG. 4(D).
FIG. 5(D) shows positions of the sample shots of FIG. 5(C) in the first layer.
FIG. 5(E) shows the coordinates of a wafer mark in the sample shot.

FIG. 5(A) shows examples of sample shots selected from the shot map of FIG. 4(B) for exposure by the one-shot type exposure apparatus 21 having an exposure field of a single-chip size, without consideration of the shot map for the first layer. In FIG. 5(A), 10 sample shots 37A to 37J are selected from the shot areas SA1 to SAM. As shown in FIG. 5(B), these sample shots 37A to 37J correspond to chip patterns (such as C2 and C3) randomly selected from shot areas S2, S4, S7, . . . , S23 in the shot array in the first layer.

Each of the sample shots 37A to 37J in FIG. 5(A) includes a pair of wafer marks [either of wafer marks MR1 and ML1, MR2 and ML2 and MR3 and ML3 in FIG. 3(A)], which are formed in the chip pattern corresponding to the sample shot. With respect to a pair of wafer marks in the chip pattern corresponding to each sample shot, for example, information on the design coordinates of the center of the chip pattern in the sample coordinate system (x, y) and the respective design relative coordinates of the wafer marks in the chip pattern relative to the center of the chip pattern is supplied to the main controller 28. The main controller 28 controls the alignment sensor 32 so as to detect the respective coordinates of the wafer marks to be measured in a stage coordinate system (X, Y) in which an X coordinate and a Y coordinate are measured by the laser interferometer 31 shown in FIG. 2(A).

FIG. 5(E) shows the n-th sample shot 37 to be measured. In FIG. 5(E), for example, information on the design coordinates ($cx_n$, $cy_n$) of the center 50 of the sample shot 37 in the sample coordinate system (x, y) and the design relative coordinates ($dx_n$, $dy_n$) of the wafer mark to be measured (e.g., wafer mark MLk) relative to the center 50 in a coordinate system having its origin set at the center 50 is supplied to the main controller 28. The design coordinates ($Sx_n$, $Sy_n$) of the wafer mark MLk in the sample coordinate system (x, y) is determined in accordance with the following set of equations (1).

$$Sx_n = cx_n + dx_n$$

$$sy_n = cy_n + dy_n \quad (1)$$

The position of each wafer mark on the wafer W is preliminarily and roughly measured by, for example, search alignment. Based on the position of the wafer mark MLk measured by search alignment, the wafer mark MLk is moved to a field of view of the alignment sensor 32 and the actual coordinates ($Dx_n$, $Dy_n$) of the wafer mark MLk in the stage coordinate system (X, Y) are measured. In the above-mentioned manner, measurement of actual coordinates in the stage coordinate system (X, Y) is conducted with respect to the wafer mark (to be measured) included in each sample shot. Thereafter, in order to separate linear errors and non-linear errors with respect to differences of the actual measurement values from the design values, 6 linear parameters with respect to the shot array, i.e., wafer scaling parameters Rx and Ry which represent linear expansion and contraction of the wafer W in the X direction and the Y direction, a wafer rotation angle $\Theta$ which is a rotation angle of the shot array in the first layer relative to the X-axis of the stage coordinate system (X, Y), a wafer perpendicularity error $\Omega$ which represents a tilt angle of the shot array in the first layer relative to the Y-axis of the stage coordinate system (X, Y) and offsets Ox and Oy in the X direction and the Y direction are employed. Using these 6 parameters, the design coordinates ($Sx_n$, $Sy_n$) of the wafer mark MLk in the sample coordinate system (x, y) are converted into computational array coordinates ($Fx_n$, $Fy_n$) in the stage coordinate system (X, Y), as indicated by the following equation (2).

$$\begin{bmatrix} Fx_n \\ Fy_n \end{bmatrix} = \begin{bmatrix} Rx & -Rx \cdot (\Omega + \Theta) \\ Ry \cdot \Theta & Ry \end{bmatrix} \begin{bmatrix} Sx_n \\ Sy_n \end{bmatrix} + \begin{bmatrix} Ox \\ Oy \end{bmatrix} \quad (2)$$

Further, differences of the actual coordinates ($Dx_n$, $Dy_n$) in the stage coordinate system (X, Y) from the computational array coordinates ($Fx_n$, $Fy_n$) in the stage coordinate system (X, Y) are determined as non-linear errors ($\epsilon x_n$, $\epsilon y_n$), as indicated by the following set of equations (3).

$$\epsilon x_n = Fx_n - Dx_n$$

$$\epsilon y_n = Fy_n - Dy_n \quad (3)$$

Then, the respective values of 6 parameters Rx, Ry, $\Theta$, $\Omega$, Ox and Oy are determined by the least square method so that a residual error component which is determined by totaling the respective sums of squares ($\epsilon x_n^2 + \epsilon y_n^2$) of the non-linear errors ($\epsilon x_n$, $\epsilon y_n$) with respect to all of the measured wafer marks is minimized. Subsequently, for effecting exposure of the second layer so as to form the shot array shown in FIG. 5(A), with respect to each of the shot areas SA1 to SAM, the design array coordinates of the center of the shot area are assigned to the design coordinates ($Sx_n$, $Sy_n$) in the equation (2), to thereby calculate the computational array coordinates ($Fx_n$, $Fy_n$) of the center of the shot area. Based on the computational array coordinates ($Fx_n$, $Fy_n$) of the center of each of the shot areas SA1 to SAM, alignment of the XY stage 30 shown in FIG. 2(A) is conducted and the pattern on the reticle 23 is transferred to each of shot areas SA1 to SAM, without being affected by linear errors with respect to the shot array, such as expansion and contraction and rotation of the wafer W.

However, when a rotation (shot rotation) or a magnification error occurs in each shot area Si in the shot array in the first layer shown in FIG. 4(A), a high overlay accuracy cannot be satisfactorily achieved simply by alignment using the above-mentioned 6 parameters.

FIG. 6(A) shows a rotation of the shot area S1 taken as an example of the shot areas Si. In FIG. 6(A), a pattern image in the shot area S1 is rotated on a shot center 40A of an ideal shot area 39A at a predetermined angle. In this instance, when alignment is conducted simply using the above-mentioned 6 parameters, a rotation does not occur in the shot area SAi in the second layer, so that an overlay error occurs. In order to suppress such an overlay error, in this example, the respective positions of a plurality of wafer marks are measured, with respect to each of the sample shots 37A to 37J shown in FIG. 5(A). Each of the sample shots 37A to 37J in FIG. 5(A) includes a pair of wafer marks on the right and left thereof, so that the respective positions of a pair of wafer marks are measured, with respect to each of the sample shots 37A to 37J. For effecting exposure of the second layer by the one-shot type exposure apparatus 21 having an exposure field of a two-chip size in accordance with the shot map of FIG. 4(D), because four wafer marks are included in each shot area SBi, the respective positions of these four wafer marks may be measured. Wafer marks may be formed so that more than four wafer marks can be measured, with respect to each sample shot.

For effecting exposure of the second layer by the one-shot type exposure apparatus 21 of FIG. 2(A), in-shot linear errors in the first layer which can be corrected are, for example, a shot rotation which can be corrected by rotating the reticle 23 (rotating the reticle stage 25) and an isotropic magnification error which can be corrected by adjusting the projection magnification β2 of the projection optical system 24. For example, with respect to the n-th sample shot 37 shown in FIG. 5(E), when measurement is conducted with respect to wafer marks MLk and MRk at two points in the sample shot 37, the isotropic shot magnification $r_n$ and the shot rotation angle $\theta_n$ of the sample shot 37 are determined from a difference in the X coordinate between the wafer marks MLk and MRk and a difference in the Y coordinate between the wafer marks MLk and MRk, respectively.

For effecting exposure of the second layer by the one-shot type exposure apparatus 21 having an exposure field of a two-chip size, the respective positions of 3 or more wafer marks in the n-th sample shot may be measured. When the respective positions of 3 or more wafer marks in the n-th sample shot are measured, the design relative coordinates ($dx_m$, $dy_m$) of the m-th wafer mark of the 3 or more wafer marks relative to the shot center of the n-th sample shot are converted into computational array coordinates ($fx_m$, $fy_m$), as indicated by the following equation (4).

$$\begin{bmatrix} fx_m \\ fy_m \end{bmatrix} = \begin{bmatrix} r_n & -r_n \cdot \theta_n \\ r_n \cdot \theta_n & r_n \end{bmatrix} \begin{bmatrix} dx_m \\ dy_m \end{bmatrix} \quad (4)$$

In this case, the design array coordinates ($cx_n$, $cy_n$) of the shot center are assigned to the design coordinates ($Sx_n$, $Sy_n$) in the equation (2) in order to correct an array error of the shot center. With respect to the equation (4), the respective values of shot magnification $r_n$ and shot rotation angle $\theta_n$ are calculated using the equation (4) by the least square method, in order to correct an error of the relative coordinates of the m-th wafer mark relative to the shot center. Illustratively stated, when the actual coordinates of the m-th wafer mark measured by the alignment sensor 32 are converted into the relative coordinates ($ex_m$, $ey_m$) relative to the shot center, the non-linear errors ($\delta x_m$, $\delta y_m$) are determined as ($fx_m - ex_m$, $fy_m - ey_m$). The shot magnification $r_n$ and the shot rotation angle $\theta_n$ are determined so that the sums of squares of non-linear errors of all of the 3 or more wafer marks contained in the n-th sample shot (a residual error component) are minimized. Thus, errors in positions of wafer marks in the first layer due to distortion are equalized, so that the shot magnification rn and the shot rotation angle $\theta_n$ can be determined with a high accuracy.

Because the shot magnification $r_n$ and the shot rotation angle $\theta_n$ are determined with respect to each sample shot, a final isotropic shot magnification (chip scaling) r and shot rotation angle (chip rotation angle) θ are determined from an average value of the respective shot magnifications $r_n$ of all sample shots (number: K) and an average value of the respective shot rotation angles $\theta_n$ of all sample shots, in accordance with the following set of equations (5).

$$r = (\Sigma r_n)/K \quad (5)$$

$$\theta = (\Sigma \theta_n)/K$$

For effecting exposure of the second layer using the one-shot type exposure apparatus 21 of FIG. 2(A) so as to form the shot array shown in FIG. 5(A), the projection magnification β2 of the projection optical system 24 is adjusted according to the final shot magnification r and the rotation angle of the reticle 23 is adjusted according to the final shot rotation angle θ. The above-mentioned alignment method using 2 parameters (shot magnification r and shot rotation angle θ) in addition to the 6 parameters in the equation (2) is hereinafter referred to as "in-shot two-point EGA method". FIG. 6(B) shows an overlay condition achieved by exposure of the second layer after alignment by the in-shot two-point EGA method. Incidentally, in FIG. 6(B), for the sake of convenience, the shot numbers are changed from those in FIG. 5(A).

In FIG. 6(B), the rotation angle of each of the shot areas SA1, SA2 and SA3 arrayed in the Y direction is adjusted, according to the rotation angle of the shot area S1 in the first layer. However, alignment is conducted using sample shots which are randomly selected, without consideration of information on the shot array in the first layer, so that the respective shot centers of the shot areas SA1, SA2 and SA3 are arrayed along a one-dot-chain straight line 41 which passes through the shot centers in the first layer in the Y direction, that is, an axis of array after correction of linear errors of the shot array in the first layer. Therefore, although a high overlay accuracy is achieved with respect to the shot area SA2 at a central portion of the shot area Si, large overlay errors Δ1 occur substantially along the X-axis in the shot areas SA1 and SA3 at upper and lower portions of the shot area S1.

FIG. 5(C) shows examples of sample shots randomly selected for effecting exposure of the second layer on the shot areas S1 to SN shown in FIG. 4(C), using the one-shot type exposure apparatus 21 of FIG. 2(A) having an exposure field of a two-chip size, so as to form shot areas SB1 to SBL as shown in FIG. 4(D). In FIG. 5(C), 8 sample shots 38A to 38H are randomly selected. These sample shots 38A to 38H correspond to chip patterns C2, C3, . . . which are randomly selected from the shot areas S2, S4, S7, . . . , S23 in the first layer shown in FIG. 5(D).

In this case, as shown in FIG. 6(C) [the shot numbers in FIG. 6(C) and the shot numbers in FIG. 6(D) are changed], the shot areas S1 and S2 in the first layer are rotated on the shot centers 40A and 40B of the ideal shot areas 39A and 39B, respectively. With respect to each of the sample shots 38A to 38H in FIG. 5(C), the respective positions of a plurality of wafer marks are measured and alignment is conducted by the in-shot two-point EGA method. That is, the shot magnification r and the shot rotation angle $\theta$ are corrected, based on the equation (4), and alignment is further conducted by the EGA method, based on the equation (2). An overlay condition achieved by exposure after the above-mentioned alignment is shown in FIG. 6(D).

In FIG. 6(D), adjustment of the rotation angle of each of the shot areas SB1, SB2 and SB3 arrayed in the second layer in the Y direction is effected. However, because the respective shot centers of the shot areas SB1, SB2 and SB3 are arrayed along a one-dot-chain straight line 42 which passes through the respective shot centers of the shot areas S1 and S2 in the first layer in the Y direction (an axis of array after correction of linear errors of the shot array in the first layer), not only does a large overlay error $\Delta 3$ occur substantially along the X-axis in the shot area SB2 which extends over the shot areas S1 and S2, but small overlay errors $\Delta 2$ also occur substantially along the X-axis in the shot areas SB1 and SB3 above and below the shot area SB2.

(II) Alignment by the in-shot two-point EGA method in which sample shots are selected in consideration of the shot array in the first layer:

Large overlay errors shown in FIG. 6(B) and FIG. 6(D) occur because for forming the second layer by exposure, the sample shots are randomly selected, without consideration of the shot map for the first layer. Therefore, in the present invention, the sample shots for the second layer are selected in consideration of the shot array in the shot map for the first layer and the exposure field size (shot size) of the scanning type exposure apparatus for exposure of the first layer.

Hereinbelow, explanation is made on an example (II-1) in which exposure of the first layer is effected by the scanning type exposure apparatus having an exposure field of a three-chip size and exposure of the second layer is effected by the one-shot type exposure apparatus having an exposure field of a single-chip size.

FIG. 7(A) shows positions of sample shots in the first layer for effecting exposure of the second layer using the one-shot type exposure apparatus 21 having an exposure field of a single-chip size. As shown in FIG. 7(A), three chip patterns are formed in each shot area in the first layer, and 10 shot areas S1, S3, S5 . . . , S24 are selected from the shot areas in the first layer. Further, the respective central chip patterns C2 (indicated by hatching) in the shot areas S1, S3, S5, . . . , S24 are selected as the sample shots for the second layer. Accordingly, in the shot array (shot areas SA1 to SAM) in the second layer shown in FIG. 7(B), a shot area SA6 (accurately, an area which is to become the shot area SA6 by exposure) is selected as a first sample shot 37A and 9 shot areas are further selected as sample shots 37B, 37C, . . . , 37J.

FIG. 8(A) shows an enlarged view of each of the sample shots 37A to 37J in the second layer shown in FIG. 7(B). As shown in FIG. 8(A), each of the sample shots 37A to 37J corresponds to the central chip pattern C2 in one shot area in the first layer, so that measurement is conducted with respect to each of alignment marks MR2 and ML2 on the right and left of the chip pattern C2. A middle point between the alignment marks MR2 and ML2 is determined as a shot center M2.

With respect to the sample shots 37A to 37J shown in FIG. 7(B), because each of the sample shots 37A to 37J includes two wafer marks MR2 and ML2, the 6 parameter values (Rx, Ry, $\Theta$, $\Omega$, Ox, Oy) in the equation (2) and 2 in-shot parameter values (r, $\theta$) in the equation (5) are calculated and alignment is conducted by the in-shot two-point EGA method, using these 8 parameter values.

Figure 9:
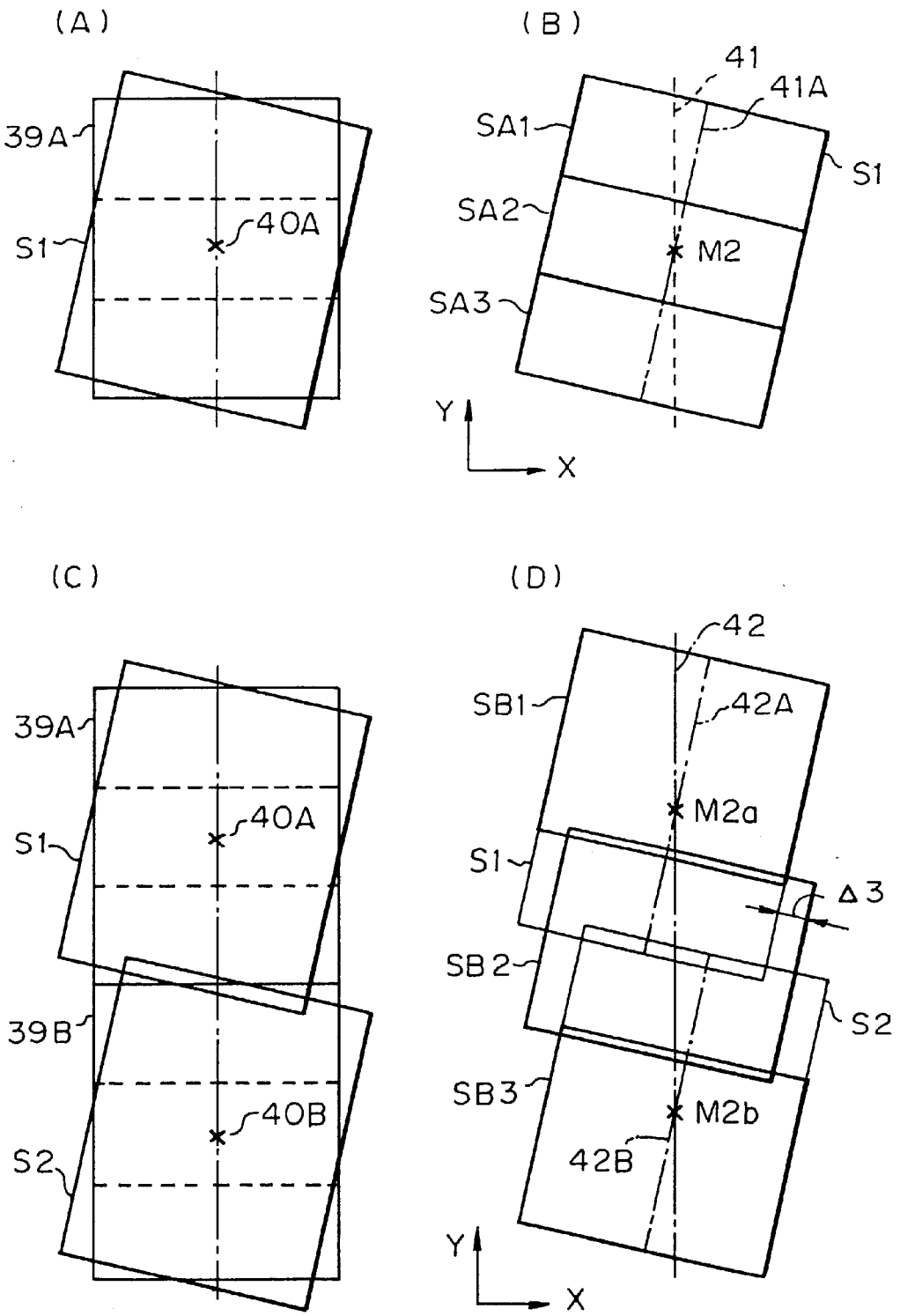
FIG. 9(A) is an illustration showing how a shot rotation occurs in each shot area in FIG. 4(A).
FIG. 9(B) is an illustration showing an overlay condition achieved by exposure after alignment using the sample shots of FIG. 8(A).
FIG. 9(C) is an illustration showing how a shot rotation occurs in each shot area in FIG. 4(C).
FIG. 9(D) is an illustration showing an overlay condition achieved by exposure after alignment using the sample shots of FIG. 8(B) and FIG. 8(C).

In the example (II-1), as shown FIG. 9(A), the shot area S1 is rotated on the shot center 40A relative to the ideal shot area 39A. Therefore, in the example (II-1), the shot rotation angle $\theta$ is calculated, based on the respective positions of the wafer marks MR2 and ML2 in FIG. 8(A) which are located on the right and left sides of the shot center M2. It is considered that the calculated shot rotation angle $\theta$ is a rotation angle of each of the shot areas S1 to SN in the first layer and that the respective centers of three chip patterns in each of the shot areas S1 to SN are tilted at an angle equal to the shot rotation angle $\theta$ around the shot center 40A. For effecting exposure of the second layer in order to overlay the shot areas SA1 to SA3 on the shot area S1, as shown in FIG. 9(B), the rotation angle of each of the shot areas SA1 to SA3 is set to an angle equal to the shot rotation angle $\theta$ and then, the respective centers of the shot areas SA1 to SA3 are positioned along a straight line 41A obtained by rotating on one shot center M2 at the angle $\theta$ the straight line 41 which passes through the shot centers in the shot array in the first layer in the Y direction, the positions of which are calculated by the in-shot two-point EGA method. Thus, the shot areas SA1 to SA3 coincide with the shot area S1 in the first layer. That is, the overlay errors $\Delta 1$ shown in FIG. 6(B) are eliminated.

Next, explanation is made on an example (II-2) in which exposure of the first layer is effected by the scanning type exposure apparatus having an exposure field of a three-chip size and exposure of the second layer is effected by the one-shot type exposure apparatus having an exposure field of a two-chip size.

FIG. 7(C) shows positions of sample shots in the first layer for effecting exposure of the second layer using the one-shot type exposure apparatus 21 having an exposure field of a two-chip size. In FIG. 7(C), as in the case of FIG. 7(A), the respective central chip patterns C2 (indicated by hatching) in the shot areas S1, S3, S5, . . . , S24 in the first layer are selected as the sample shots for the second layer. Accordingly, in the shot array (shot areas SB1 to SBL) in the second layer shown in FIG. 7(D), a shot area SB6 (accurately, an area which is to become the shot area SB6 by exposure) is selected as a first sample shot 38A and 9 shot areas are further selected as sample shots 38B, 38C, . . . , 38J. However, when exposure of the second layer is effected using the one-shot type exposure apparatus 21 having an exposure field of a two-chip size, the sample shots 38A to 38F are divided into two groups, that is, a group of shot areas 38D, 38F to 38H, 38J in each of which the wafer marks to be measured are located at a lower portion (hereinafter, frequently referred to simply as "a shots") and a group of shot areas 38A to 38C, 38E, 38I in each of which the wafer marks to be measured are located at an upper portion (hereinafter, frequently referred to simply as "b shots"). Thus, in the example (II-2), the shot areas SB18 to SB24 in the second layer, each of which extends over two shot areas in the first layer, are not selected as the sample shots.

FIG. 8(B) is an enlarged view of each of the above-mentioned 5 sample shots 38D, 38F to 38H and 38J, i.e., a shots in the second layer shown in FIG. 7(D). In FIG. 8(B), each of the a shots corresponds to the chip patterns C1 and C2 in one shot area in the first layer and measurement is conducted with respect to each of alignment marks MR2 and ML2 on the right and left of the lower chip pattern C2. A middle point between the alignment marks MR2 and ML2 is determined as a shot center M2a. FIG. 8(C) is an enlarged view of each of the above-mentioned 5 sample shots 38A to 38C, 38E and 38I, i.e., b shots in the second layer shown in FIG. 7(D). In FIG. 8(C), each of the b shots corresponds to the chip patterns C2 and C3 in one shot area in the first layer and measurement is conducted with respect to each of alignment marks MR2 and ML2 on the right and left of the upper chip pattern C2. A middle point between the alignment marks MR2 and ML2 is determined as a shot center M2b.

With respect to the sample shots 38A to 38J shown in FIG. 7(D), two wafer marks MR2 and ML2 are included in each of the sample shots 38A to 38J. Therefore, in the example (II-2), alignment is conducted by the in-shot two-point EGA method.

In the example (II-2), as shown in FIG. 9(C), the successive shot areas S1 and S2 in the first layer are rotated on the shot centers 40A and 40B relative to the ideal shot areas 39A and 39B, respectively. Therefore, in the example (II-2), the shot rotation angle $\theta$ is calculated, based on the respective positions of the wafer marks MR2 and ML2 in FIG. 8(B) and FIG. 8(C) which are formed in the central chip pattern C2 in one shot area in the first layer. For effecting exposure of the second layer in order to overlay the shot areas SB1 to SB3 on the shot areas S1 and S2 as shown in FIG. 9(D), the rotation angle of each of the shot areas SB1 to SB3 is set to an angle equal to the shot rotation angle $\theta$.

Then, the shot area SB1 is positioned along a straight line 42A obtained by rotating on the upper shot center M2a at the angle $\theta$ the straight line 42 which passes through the shot centers in the shot array in the first layer in the Y direction, the positions of which are calculated by the in-shot two-point EGA method, and the shot area SB3 is positioned along a straight line 42B obtained by rotating the straight line 42 on the lower shot center M2b at the angle $\theta$. The center of the central shot area SB2 is set to a middle point between the upper and lower shot centers M2a and M2b, that is, the center of the shot area SB2 is set at a position such that the upper and lower shot centers M2a and M2b are symmetrically positioned. Thus, the shot areas SB1 and SB3 are completely overlaid on the shot areas S1 and S2 in the first layer, respectively. That is, the overlay errors Δ2 shown in FIG. 6(D) are eliminated. Further, in the example (II-2), areas which are located at positions equivalent to the positions of the shot areas (SB1 and SB3) above and below the shot area (SB2) which extends over two shot areas (S1 and S2) in the first layer are selected as the sample shots. That is, in the example (II-2), the sample shots are symmetrically positioned in the second layer. Overlay errors in the second layer as a whole are suppressed by alignment using these sample shots.

(III) Alignment by the in-shot multipoint EGA method in which sample shots are selected in consideration of the shot array in the first layer:

When the in-shot errors in the first layer are only an isotropic shot magnification error and a shot rotation, a substantially high overlay accuracy can be achieved by the in-shot two-point EGA method. However, when exposure is effected using the scanning type exposure apparatus 1, a perpendicularity error is likely to occur in the scanning direction, because it is difficult to move the reticle 23 and the wafer W in parallel in the scanning direction. When the perpendicularity error in the scanning direction occurs in each of shot areas in the first layer which is exposed by the scanning type exposure apparatus 1, the perpendicularity error cannot be detected by measurement of the respective positions of two wafer marks [shown in FIG. 8(A) to FIG. 8(C)] arrayed in the direction perpendicular to the scanning direction, so that an overlay error inevitably occurs.

Illustratively stated, for effecting exposure of the second layer by the one-shot type exposure apparatus 21 having an exposure field of a single-chip size, when the shot area S1 in the first layer is deformed into a parallelogram relative to the ideal shot area 39A as shown in FIG. 10(A), due to the perpendicularity error in the scanning direction, the perpendicularity error cannot be detected by the in-shot two-point EGA method. Therefore, as shown in FIG. 10(B), the shot areas SA1 to SA3 in the second layer are arrayed in a rectangular form having its center corresponding to the shot center M2 and hence, a large overlay error occurs.

For effecting exposure of the second layer by the one-shot type exposure apparatus 21 having an exposure field of a two-chip size, when the successive shot areas S1 and S2 in the first layer are deformed into parallelograms relative to the ideal shot areas 39A and 39B as shown in FIG. 10(C), due to the perpendicularity error in the scanning direction, the perpendicularity error cannot be detected by the in-shot two-point EGA method. Therefore, as shown in FIG. 10(D), the shot areas SB1 to SB3 in the second layer are arrayed in a rectangular form along a straight line which passes through the shot centers M2a and M2b and hence, a large overlay error occurs.

In order to detect not only the shot magnification error and the shot rotation, but also the in-shot perpendicularity error in the first layer, in the example (III), alignment is conducted by measuring the respective positions of wafer marks at four points on the periphery of one shot area in the first layer and alignment is conducted by the in-shot multipoint EGA method.

Hereinbelow, explanation is made on an example (III-1) in which exposure of the first layer is effected by the scanning type exposure apparatus having an exposure field of a three-chip size and exposure of the second layer is effected by the one-shot type exposure apparatus having an exposure field of a single-chip size.

Figure 11:
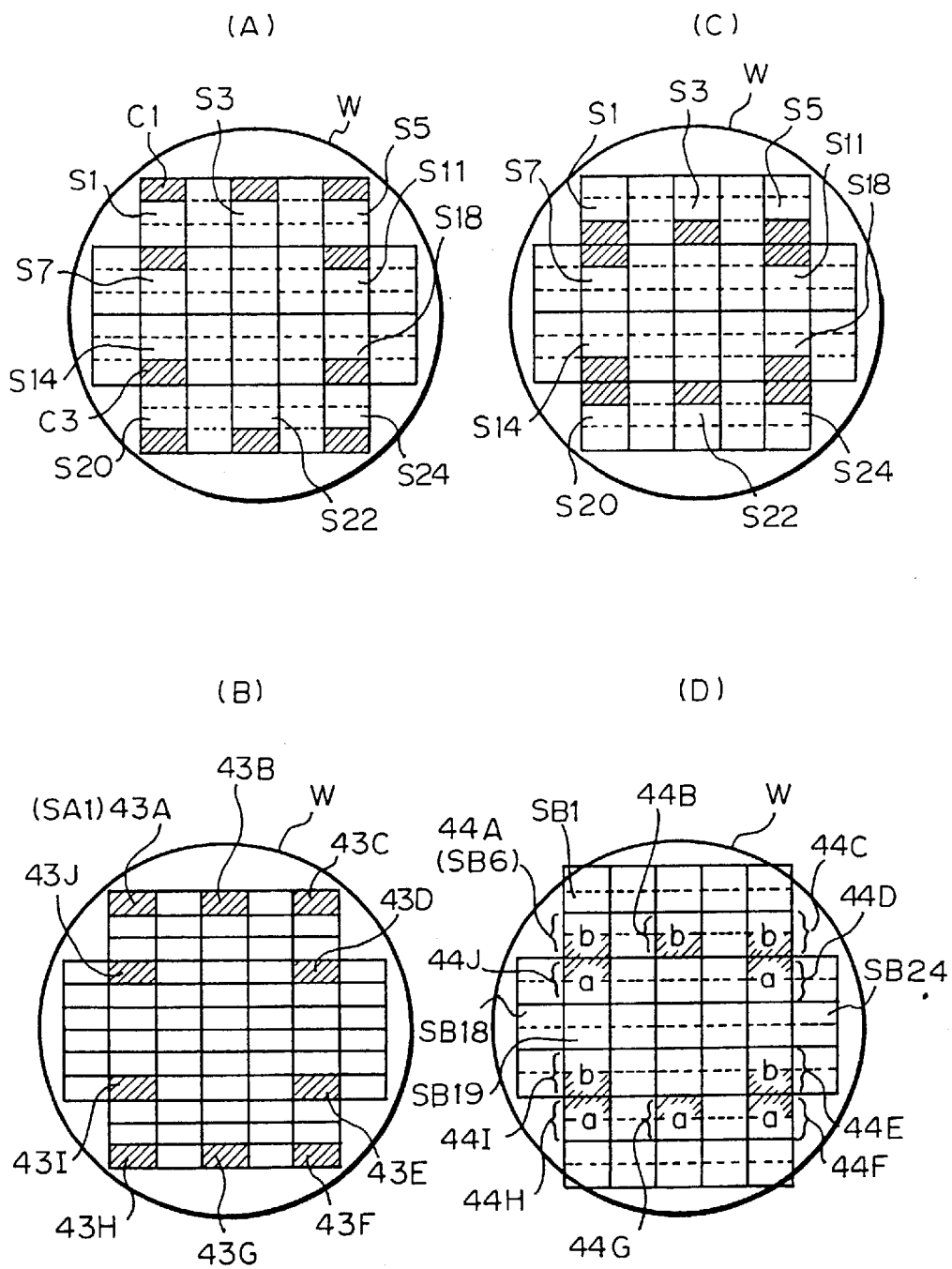
FIG. 11(A) shows positions of sample shots in the first layer according to still another example of the embodiment of the present invention, which are selected for the second layer of FIG. 4(B) in consideration of information on the first layer.
FIG. 11(B) shows positions of the sample shots of FIG. 11(A) in the second layer.
FIG. 11(C) shows positions of sample shots in the first layer according to a further example of the embodiment of the present invention, which are selected for the second layer of FIG. 4(D) in consideration of information on the first layer.
FIG. 11(D) shows positions of the sample shots of FIG. 11(C) in the second layer.

FIG. 11(A) shows positions of sample shots in the first layer for effecting exposure of the second layer using the one-shot type exposure apparatus 21 having an exposure field of a single-chip size. As shown in FIG. 11(A), three chip patterns are formed in each shot area in the first layer, and 10 shot areas S1, S3, S5, . . . , S24 are selected from the shot areas in the first layer. Further, the respective upper chip patterns C1 (indicated by hatching) in first 5 shot areas S1, . . . , S11 in the first layer and the respective lower chip patterns C3 (indicated by hatching) in the remaining 5 shot areas S14, . . . , S24 in the first layer are selected as the sample shots for the second layer. Accordingly, in the shot array (shot areas SA1 to SAM) in the second layer shown in FIG. 11(B), a shot area SA1 (accurately, an area which is to become the shot area SA1 by exposure) is selected as a first sample shot 43A and 9 shot areas are further selected as sample shots 43B, 43C, . . . , 43J.

FIG. 12(A) shows an enlarged view of each of the sample shots 43A to 43J in the second layer shown in FIG. 11(B). As shown in FIG. 12(A), each of the sample shots 43A to 43D and 43J corresponds to the upper chip pattern C1 in one shot area in the first layer, and measurement is conducted with respect to each of alignment marks MR1 and ML1 on the right and left of the chip pattern C1. With respect to the sample shots 43E to 43I, each of these sample shots corresponds to the lower chip pattern C3 in one shot area in the first layer, and measurement is conducted with respect to each of alignment marks MR3 and ML3 on the right and left of the chip pattern C3. A middle point between the alignment marks MR1 and ML1 and a middle point between the alignment marks MR3 and ML3 are determined as a shot center M1 and a shot center M3, respectively.

With respect to the sample shots 43A to 43J shown in FIG. 11(B), the wafer marks in each of the sample shots 43A to 43J are two wafer marks (e.g., MR1 and ML1) of four wafer marks (e.g., MR1, ML1, MR3 and ML3) on the periphery of one shot area (e.g., S1) in the first layer. With respect to the n-th wafer mark to be measured, the computational array coordinates ($fx_n$, $fy_n$) are calculated from the design relative coordinates ($dx_n$, $dy_n$) of the n-th wafer mark relative to the shot center in the first layer, the respective shot magnifications rx and ry in the X direction and the Y direction, a shot rotation angle θ which is a rotation angle relative to the X-axis and a shot perpendicularity error ω which represents a tilt angle relative to the Y-axis, in accordance with the following equation (6).

$$\begin{bmatrix} fx_n \\ fy_n \end{bmatrix} = \begin{bmatrix} rx & -rx \cdot (\omega + \theta) \\ ry \cdot \theta & ry \end{bmatrix} \begin{bmatrix} dx_n \\ dy_n \end{bmatrix} \quad (6)$$

The respective values of 6 parameters (Rx, Ry, Θ, Ω, Ox, Oy) with respect to the shot array are determined in accordance with the least square method by assigning the design coordinates of the shot center in the first layer to the design coordinates ($Sx_n$, $Sy_n$) in the equation (2). Further, using the actual relative coordinates ($ex_n$, $ey_n$) of the n-th wafer mark relative to the shot center in the first layer, the respective values of 4 in-shot parameters (rx, ry, θ, ω) are determined in accordance with the equation (6) so that the residual error component is minimized. Then, alignment is conducted, using these 10 parameter values.

In the example (III-1), as shown in FIG. 13(A), the perpendicularity error occurs in the scanning direction in the shot area S1 in the first layer, relative to the ideal shot area 39A. In the example (III-1), the shot rotation angle θ and the shot perpendicularity error ω are calculated, so that the reticle 23 shown in FIG. 2(A) is rotated at an angle (θ+ω/2) and then, the projection magnification β2 of the projection optical system 24 is adjusted, based on the shot magnification rx in the X direction. Further, for effecting exposure of the second layer in order to overlay the shot areas SA1 to SA3 in the second layer on the shot area S1 as shown in FIG. 13(B), the respective centers of the shot areas SA1 to SA3 are positioned along a straight line which is tilted at an angle corresponding to the shot perpendicularity error o relative to the direction of the shot array along the Y-axis, and the intervals between the respective centers of the shot areas SA1 to SA3 are determined, based on the shot magnification ry in the Y direction. Thus, the shot areas SA1 to SA3 substantially coincide with the shot area S1 in the first layer. That is, a substantial amount of the overlay error shown in FIG. 10(B) is eliminated. In other words. the effects of both the anisotropic magnification error and the perpendicularity error in the first layer due to the scanning type exposure apparatus 1 on the overlay accuracy in exposure by the mix-and-match method can be substantially minimized.

Next, explanation is made on an example (III-2) in which exposure of the first layer is effected by the scanning type exposure apparatus having an exposure field of a three-chip size and exposure of the second layer is effected by the one-shot type exposure apparatus having an exposure field of a two-chip size.

FIG. 11(C) shows positions of sample shots in the first layer for effecting exposure of the second layer using the one-shot type exposure apparatus 21 having an exposure field of a two-chip size. In FIG. 11(C), as in the case of FIG. 11(A), the peripheral chip patterns (indicated by hatching) in the shot areas S1, S3, S5, ..., S24 in the first layer are selected as the sample shots for the second layer. Accordingly, in the shot array (shot areas SB1 to SBL) in the second layer shown in FIG. 11(D), a shot area SB6 (accurately, an area which is to become the shot area SB6 by exposure) is selected as a first sample shot 44A and 9 shot areas are further selected as sample shots 44B, 44C, ..., 44J. However, when exposure of the second layer is effected using the one-shot type exposure apparatus 21 having an exposure field of a two-chip size, the sample shots 44A to 44J are divided into two groups, that is, a group of shot areas 44D, 44F to 44H, 44J in each of which the wafer marks to be measured are located at an upper portion (hereinafter, frequently referred to simply as "a shots") and a group of shot areas 44A to 44C, 44E, 44I in each of which the wafer marks to be measured are located at a lower portion (hereinafter, frequently referred to simply as "b shots"). Thus, in this example, the shot areas SB18 to SB24 in the second layer, each of which extends over two shot areas in the first layer, are not selected as the sample shots.

FIG. 12(B) is an enlarged view of each of the above-mentioned 5 sample shots 44D, 44F to 44H and 44J, i.e., a shots in the second layer shown in FIG. 11(D). In FIG. 12(B), each of the a shots corresponds to the chip patterns C1 and C2 in one shot area in the first layer and measurement is conducted with respect to each of alignment marks MR1 and ML1 on the right and left of the upper chip pattern C1. A middle point between the alignment marks MR1 and ML1 is determined as a shot center M1a. FIG. 12(C) is an enlarged view of each of the above-mentioned 5 sample shots 44A to 44C, 44E and 44I, i.e., b shots in the second layer shown in FIG. 11(D). In FIG. 12(C), each of the b shots corresponds to the chip patterns C2 and C3 in one shot area in the first layer and measurement is conducted with respect to each of alignment marks MR3 and ML3 on the right and left of the lower chip pattern C3. A middle point between the alignment marks MR3 and ML3 is determined as a shot center M3b.

Referring back to FIG. 11(D), in the example (III-2), alignment is conducted by the in-shot multipoint EGA method, based on the wafer marks in the sample shots 44A to 44J.

In the example (III-2), as shown in FIG. 13(C), the perpendicularity error in the scanning direction occurs in each of the successive shot areas S1 and S2 in the first layer, relative to the ideal shot areas 39A and 39B. In the example (III-2), the shot rotation angle θ and the shot perpendicularity error ω are calculated. For effecting exposure of the second layer in order to overlay the shot areas SB1 to SB3 on the shot areas S1 and S2 as shown in FIG. 13(D), the rotation angle of each of the shot areas SB1 to SB3 is adjusted to an angle (θ+ω/2) and the projection magnification β2 is adjusted, based on the shot magnification rx in the X direction.

Then, the shot areas SB1 and SB3 are positioned along a straight line which is obtained by rotating at an angle corresponding to the shot perpendicularity error ω a straight line which passes through the shot centers in the shot array in the first layer in the Y direction, the positions of which are calculated by the EGA method. The center of the central shot area SB2 is set as being tilted at an angle equal to the tilt angle of each of the upper and lower shot areas SB1 and SB3 and being positioned in the middle between the shot areas SB1 and SB3 along the X-axis, that is, the center of the shot area SB2 is set at a position such that the upper and lower shot centers are symmetrically positioned. Thus, the shot areas SB1 and SB3 are overlaid on the shot areas S1 and S2 with a substantially high accuracy, and the shot area SB2 is overlaid on the shot areas S1 and S2 with a relatively high accuracy, so that the overlay error shown in FIG. 10(D) is suppressed. Further, in the example (III-2), areas which are located at positions equivalent to the positions of the shot areas (SB1 and SB3) above and below the shot area (SB2) in the second layer which extends over two shot areas (S1 and S2) in the first layer are selected as the sample shots. That is, in the example (III-2), the sample shots are symmetrically positioned in the second layer. Overlay errors in the second layer as a whole are suppressed by alignment using these sample shots.

With respect to the shot area SB2 which extends over the shot areas S1 and S2 in the first layer, although an overlay accuracy is relatively high due to symmetrical positioning of the sample shots, a small overlay error still remains.

When comparison is made between FIG. 13(B) and FIG. 13(D), it is understood that for effecting exposure by the mix-and-match method using two exposure apparatuses having respective exposure fields of different sizes, when the size of the exposure field of one exposure apparatus is not a multiple of an integer of that of the other exposure apparatus, relative to each of the X direction and Y direction, it is difficult to markedly suppress an overlay error by correcting the in-shot errors in the first layer.

In the above-mentioned embodiment of the present invention in which exposure is effected by the mix-and-match method using the scanning type exposure apparatus 1 and the one-shot type exposure apparatus 21, in order to achieve a high overlay accuracy, it is necessary to conduct measurement of the respective positions of a plurality of wafer marks with respect to each sample shot. For example, when alignment is conducted by the in-shot multiple EGA method, wherein the number of sample shots is K and the number of wafer marks included in each sample shot is J, the number of wafer marks to be measured in one wafer is as large as (K×J). When measurement of the (K×J) wafer marks is conducted with respect to each of wafers in one lot, the throughput is markedly lowered. From the viewpoint of suppressing a lowering of the throughput, measurement of the (K×J) wafer marks may be conducted with respect to first several wafers in one lot and some of the parameter values determined by measurement of the wafer marks of these several wafers may be stored as fixed values.

For example, in-shot errors corresponding to 4 in-shot parameters, namely, the shot magnifications rx and ry, the shot rotation angle θ and the shot perpendicularity error ω occur mainly due to the lens properties of the projection optical system and alignment errors of the reticle for exposure of the first layer, so that there are no significant changes in the values of these 4 parameters with respect to the wafers in a lot. Therefore, these 4 in-shot parameter values may be determined as fixed values. In this case, measurement of the (K×J) wafer marks is conducted with respect to each of first several wafers in one lot and with respect to the remaining wafers, measurement of the position of one wafer mark in each sample shot is conducted and the fixed values are used as the 4 in-shot parameter values. Thus, not only does the throughput become high, but the overlay accuracy also becomes high.

When measurement of a plurality of wafer marks is conducted with respect to each of several wafers in one lot, measurement may be conducted with respect to all the measurable wafer marks formed on the wafer. Thus, not only can the values of the in-shot parameters (rx, ry, θ, ω) be determined with a high accuracy, but also errors in positions of the wafer marks in the first layer due to distortion can be equalized (suppressed), so that the overlay accuracy becomes high.

In the above-mentioned embodiment of the present invention, the scanning type exposure apparatus 1 is employed for exposure of the first layer and the one-shot type exposure apparatus 21 is employed for exposure of the second layer. However, in the present invention, a scanning type exposure apparatus utilizing an i-line as exposure light may be used for exposure of the second layer, instead of the one-shot type exposure apparatus 21.

Further, when the size of the exposure field of the scanning type exposure apparatus 1 for exposure of the first layer is set to a size equal to that of the one-shot type exposure apparatus 21 for exposure of the second layer (although a lowering of the throughput inevitably occurs), alignment may be conducted by the in-shot multipoint EGA method. In this case, exposure is effected by two exposure apparatuses having respective exposure fields of the same size, so that the above-mentioned overlay error due to the shot area in the second layer which extends over two shot areas in the first layer does not occur. However, even when exposure is effected by two exposure apparatuses having respective exposure fields of the same size, the 4 parameter values corresponding to in-shot errors (shot magnifications rx and ry, shot perpendicularity error ω, shot rotation angle θ) and the 6 parameter values corresponding to errors with respect to the shot array (RX and RY, Θ, Ω, OX and OY) are calculated by measuring, for example, 3 or more wafer marks in one shot area using a plurality of sample shots. When exposure of the second layer is effected by the scanning type exposure apparatus, alignment is conducted, based on these 10 parameter values. When exposure of the second layer is effected by the one-shot type exposure apparatus, an isotropic magnification error [(rx+ry)/2] is used instead of the shot magnifications rx and ry, and a shot rotation angle (θ+ω/2) is used instead of a shot rotation angle θ and the shot perpendicularity error ω is determined as zero. Thus, alignment is conducted using 8 parameters in total. Therefore, with respect to first several wafers in one lot, the parameter values which can be used as in-lot fixed values (mainly, parameter values corresponding to the errors which occur due to scanning type exposure and can be corrected only by measuring wafer marks at four or more points in one shot area) are stored, and with respect to the remaining wafers, the number of wafer marks to be measured is reduced so as to improve the throughput and the stored parameter values are used for non-determinable parameter values to thereby achieve a high overly accuracy.

In the exposure method of the present invention, predetermined alignment marks on the substrate are selected, based on the exposure field size for exposure of the first layer on the substrate and information on the shot array in the first layer, and alignment of shot areas for the second layer is conducted, based on the positions of the selected alignment marks. Therefore, when exposure is effected by the mix-and-match method using two exposure apparatuses having respective exposure fields of different sizes, for example, when the exposure field for exposure of the second layer is smaller than the exposure field for exposure of the first layer, a high overlay accuracy can be achieved.

According to the present invention, a high overlay accuracy can be achieved even when exposure is effected by the mix-and-match method using a scanning exposure type projection exposure apparatus and a one-shot exposure type projection exposure apparatus having respective exposure fields of different sizes. Therefore, it is possible to effectively use different exposure apparatuses. For example, a one-shot exposure type projection exposure apparatus (stepper) which has conventionally been used for exposure of a critical layer can be used for exposure of a rough layer which requires a high overlay accuracy.

According to a preferred embodiment of the present invention, when the exposure field size of the first exposure apparatus is set to a multiple of a non-integer of that of the second exposure apparatus, relative to a predetermined array direction, for effecting overlay exposure using the second exposure apparatus, a plurality of pairs of shot areas are selected from the shot areas in the second shot array, the plurality of pairs of shot areas having therebetween the shot areas in the second shot array which extend over borders between the shot areas in the first shot array, and the alignment marks included in predetermined shot areas of the plurality of pairs of shot areas are selected. By this arrangement, the shot areas in the second layer which are affected by in-shot errors of two adjacent shot areas in the first shot array are not selected, so that in-shot errors in the first shot array can be accurately corrected. Therefore, according to the present invention, a high overlay accuracy can be achieved even when exposure is effected by the mix-and-match method, wherein the length in a predetermined direction of the exposure field for first exposure is a multiple of a non-integer of that for subsequent exposure.

According to another preferred embodiment of the present invention, a plurality of alignment marks are transferred with respect to each of chip patterns to be transferred to the substrate in each of the shot areas in the first shot array. For effecting overlay exposure using the second exposure apparatus, a plurality of predetermined sample shots are selected from the shot areas in the second shot array and a plurality of alignment marks to be measured are selected from the alignment marks included in each of the plurality of predetermined sample shots. Then, 10 parameter values consisting of 6 parameter values corresponding to linear array errors and 4 parameter values corresponding to in-shot linear errors are calculated with respect to the first shot array, based on respective positions of the plurality of alignment marks to be measured, and alignment of the shot areas for the second shot array is conducted, using the 10 parameter values. When alignment of shot areas for the second shot array is conducted using the above-mentioned 10 parameters, in-shot errors in the first layer, such as shot magnification errors in two directions, a shot rotation and a shot perpendicularity error, can be corrected, to thereby achieve a high overlay accuracy.

Further, the present invention is especially advantageous when the first exposure apparatus is a scanning exposure type exposure apparatus adapted to transfer a pattern on a mask to a substrate in each of shot areas thereon by moving the mask and the substrate synchronously and the second exposure apparatus is a one-shot exposure type exposure apparatus adapted to transfer a pattern on a mask to a substrate in each of shot areas thereon by one-shot exposure, because the exposure field of the scanning exposure type exposure apparatus is larger than the exposure field of the one-shot exposure type exposure apparatus.

The contents of U.S. patent application Ser. No. 08/654,419 filed on May 28, 1996 is incorporated herein by reference. The entire disclosure of Japanese Patent Application No. HEI 9-31974 filed on Feb. 17, 1997 is also incorporated herein by reference in its entirety.

As has been described above, the present invention is not limited to the above-mentioned embodiment. Various modifications are possible without departing from the scope of the present invention as defined in the appended claims.

What is claimed is:

1. An exposure method for effecting exposure by transferring a first mask pattern to a substrate in each of shot areas in a first shot array thereon using a first exposure apparatus having a predetermined exposure field size and transferring a second mask pattern to said substrate in each of shot areas in a second shot array thereon using a second exposure apparatus having an exposure field size different from the exposure field size of said first exposure apparatus, comprising the steps of:

transferring said first mask pattern and alignment marks to said substrate in each of the shot areas in the first shot array using said first exposure apparatus;

selecting predetermined alignment marks to be measured from said alignment marks transferred to the substrate, based on the exposure field size of said first exposure apparatus and information on said first shot array;

conducting alignment of shot areas for the second shot array, based on respective positions of said predetermined alignment marks to be measured; and transferring said second mask pattern to said substrate in each of the shot areas in said second shot array using said second exposure apparatus.

2. The exposure method according to claim 1, further comprising the steps of:

setting the exposure field size of said first exposure apparatus to a multiple of a non-integer of the exposure field size of said second exposure apparatus, relative to a predetermined array direction;

selecting a plurality of pairs of shot areas from the shot areas in said second shot array, said plurality of pairs of shot areas having therebetween the shot areas in said second shot array which extend over borders between the shot areas in said first shot array; and selecting said alignment marks included in predetermined shot areas of said plurality of pairs of shot areas.

3. The exposure method according to claim 1, further comprising the steps of:

transferring a plurality of alignment marks with respect to each of chip patterns to be transferred to said substrate in each of the shot areas in said first shot array;

selecting a plurality of predetermined sample shots from the shot areas in said second shot array;

selecting a plurality of alignment marks to be measured from the alignment marks included in each of said plurality of predetermined sample shots;

calculating 10 parameter values including 6 parameter values corresponding to linear array errors and 4 parameter values corresponding to in-shot linear errors with respect to said first shot array, based on respective positions of said plurality of alignment marks to be measured; and conducting alignment of the shot areas for said second shot array, using said 10 parameter values.

4. The exposure method according to claim 1 wherein said first exposure apparatus is a scanning exposure apparatus adapted to transfer a pattern on a mask to a substrate in each of shot areas thereon by moving the mask and the substrate synchronously and said second exposure apparatus is a one-shot exposure apparatus adapted to transfer a pattern on a mask to a substrate in each of shot areas thereon by one-shot exposure.

5. An exposure method comprising:

transferring a first mask pattern to a first layer on a substrate using a first exposure apparatus;

selecting predetermined marks from a plurality of marks transferred to said first layer using a second exposure apparatus, based on exposure data with respect to a plurality of shot areas formed on said first layer by said first exposure apparatus, said exposure data including shot size data with respect to said plurality of shot areas formed on said first layer;

conducting alignment of said substrate using the second exposure apparatus, based on respective positions of said selected marks; and transferring a second mask pattern to a second layer on said substrate using the second exposure apparatus.

6. The exposure method according to claim 5, wherein said exposure data includes array data with respect to said plurality of shot areas formed on said first layer.

7. The exposure method according to claim 5, wherein said first exposure apparatus is a scanning exposure apparatus in which a mask and a substrate are adapted to synchronously move during exposure and said second apparatus is a one-shot exposure apparatus in which a mask and a substrate are substantially stationary during exposure.

8. The exposure method according to claim 5, wherein an odd number of chip patterns arrayed in a predetermined direction are formed in each of said plurality of shot areas formed on said first layer using said first exposure apparatus and marks corresponding to a central chip pattern in said odd number of chip patterns are selected as said predetermined marks.

9. The exposure method according to claim 5, wherein each of said plurality of shot areas formed on said first layer using said first exposure apparatus and each of a plurality of shot areas formed on said second layer using said second exposure apparatus are different in size and marks in predetermined shot areas of said plurality of shot areas on said second layer are selected as said predetermined marks, said predetermined shot areas being shot areas which do not extend borders between said plurality of shot areas on said first layer.

10. The exposure method according to claim 5, wherein each of said plurality of shot areas formed on said first layer and each of a plurality of shot areas formed on said second layer are different in size relative to a predetermined direction and equal in size relative to a direction substantially perpendicular to said predetermined direction.

11. The exposure method according to claim 5, wherein the size in a predetermined direction of each of said plurality of shot areas formed on said first layer is a multiple of a non-integer of the size in said predetermined direction of each of a plurality of shot areas formed on said second layer.

12. An exposure method in which a second mask pattern is transferred to a second layer on a substrate within a second exposure apparatus, wherein a first layer on the substrate includes a first mask pattern and a plurality of marks which are already formed thereon by using a first exposure apparatus, the method comprising:

selecting marks from the plurality of marks formed on said first layer based on shot size data, said shot size data indicating a size of each of a plurality of shot areas on said first layer, each of the plurality of shot areas on the first layer including said first mask pattern already formed thereon; and adjusting a position of the substrate to transfer the second mask pattern to each of a plurality of shot areas on said second layer based on positional information on said selected marks.

13. An exposure method according to claim 12, wherein each of the plurality of shot areas on said first layer includes one or more chip pattern arrayed in a predetermined direction, the number of chip pattern on each shot area on the first layer being represented by M which is an integer of 1 or more, and wherein each of the plurality of shot areas on said second layer includes one or more chip patterns arrayed in said predetermined direction, the number of chip patterns on each shot area on the second layer being represented by N which is an integer of 1 or more and is different from M.

14. An exposure method according to claim 13, wherein M is a multiple of a non-integer of N.

15. An exposure method according to claim 14, wherein said first exposure apparatus is a scanning exposure apparatus adapted to effect exposure of a shot area on a substrate by moving a mask and the substrate synchronously and wherein said second exposure apparatus is a static exposure apparatus adapted to effect exposure of a shot area on a substrate while a mask and the substrate are held substantially stationary.

16. An exposure method according to claim 15, wherein M and N satisfy the formula M>N.

17. An exposure method according to claim 15, wherein each of the plurality of shot areas on said first layer is deformed into a parallelogram and wherein said second mask pattern is rotated in relation to deformation of the shot areas on the first layer and transferred onto each of the plurality of shot areas on said second layer.

18. An exposure method according to claim 13, wherein M is an odd number and N is an even number.

19. An exposure method according to claim 18, wherein each of said selected marks is a mark included in a central chip pattern of the odd number of chip patterns in the shot area on the first layer.

20. An exposure method according to claim 13, wherein said selected marks are marks to be included in the shot areas on said second layer which do not extend over borders between the plurality of shot areas on said first layer.

21. A method for producing a device using an exposure method of claim 12.

* * * * *